(12) United States Patent
Saijo et al.

(10) Patent No.: US 7,190,216 B2
(45) Date of Patent: Mar. 13, 2007

(54) DEMODULATION CIRCUIT AND RECEIVING SET

(75) Inventors: Kazuyuki Saijo, Tokyo (JP); Moonjae Jeong, Kanagawa (JP)

(73) Assignee: Sony Corporation (JP)

( * ) Notice: Subject to any disclaimer, the term of this patent is extended or adjusted under 35 U.S.C. 154(b) by 123 days.

(21) Appl. No.: 10/525,494

(22) PCT Filed: Aug. 22, 2003

(86) PCT No.: PCT/JP03/10655

§ 371 (c)(1),
(2), (4) Date: Feb. 23, 2005

(87) PCT Pub. No.: WO2004/023751

PCT Pub. Date: Mar. 18, 2004

(65) Prior Publication Data

US 2005/0285669 A1    Dec. 29, 2005

(30) Foreign Application Priority Data

Sep. 5, 2002    (JP)    ............................. 2002-260411

(51) Int. Cl.
   *H03D 3/00*    (2006.01)
(52) U.S. Cl. .................... 329/304; 329/311; 329/345
(58) Field of Classification Search ................ 329/304, 329/311, 345
   See application file for complete search history.

(56) References Cited

U.S. PATENT DOCUMENTS 5,172,070 A    12/1992    Hiraiwa et al.
5,614,862 A    3/1997    Sun

FOREIGN PATENT DOCUMENTS

| JP | 04-177946 | 6/1992 |
| JP | 09-130148 | 5/1997 |
| JP | 09-149091 | 6/1997 |
| JP | 09-306194 | 11/1997 |

OTHER PUBLICATIONS

International Search Report dated Oct. 7, 2003.

*Primary Examiner*—Arnold Kinkead
(74) *Attorney, Agent, or Firm*—Rader Fishman & Grauer PLLC; Ronald P. Kananen

(57) ABSTRACT

In a sampling block 40a-1, an intermediate frequency signal RIFs is sampled at a frequency of the intermediate frequency signal RIFs multiplied by "1/(m+0.25)" or "1/(m+0.75)" (m: 0 or natural number), to generate signals having phase differences "0", "$\pi/2$", "$\pi$", and "$3\pi/2$". A polarity adjustment block 40a-2 matches a polarity of the signal having phase difference "$\pi$" with that of the signal having phase difference "0". Further, it matches a polarity of the signal having phase difference "$3\pi/2$" with that of the signal having phase difference "$\pi/2$". In a signal synthesis block 40a-3, the signal with phase difference "0" and the signal with phase difference "$\pi$" having phase difference "$\pi$" from each other are synthesized and held to be output as a demodulated signal PI. Further, the signal with phase difference "$\pi/2$" and the signal with phase difference "$3\pi/2$" having phase difference "$\pi$" from each other are synthesized and held to be output as a demodulated signal PQ. It is possible to provide a demodulation circuit and a receiving set that can easily obtain a good demodulated signal by a simple configuration.

10 Claims, 17 Drawing Sheets

FIG. 12A ($\phi c1$)

FIG. 12B ($\phi c2$)

FIG. 12C ($\phi c3$)

US 7,190,216 B2

DEMODULATION CIRCUIT AND RECEIVING SET

TECHNICAL FIELD

The present invention relates to a demodulation circuit and a receiving set.

BACKGROUND ART

FIG. 1 shows a configuration of a conventional receiving set. A signal RA received by an antenna 11 is supplied to a low-noise amplifier 12. The low-noise amplifier 12 amplifies the signal RA and supplies it as a received signal RB to a frequency converter 13. The frequency converter 13 is supplied with a signal RL0 having a local-oscillated frequency from an oscillator 14 and so multiplies the received signal RB and the signal RL0 to down-convert the received signal RB so that an intermediate frequency signal RIF may be generated and supplied to a bandpass filter 15.

The bandpass filter 15 limits a band of the intermediate frequency signal RIF and supplies it to a variable gain amplifier 16. The variable gain amplifier 16 amplifies the signal supplied from the bandpass filter to a predetermined signal level and supplies it as an intermediate frequency signal RIFs to frequency converters 17 and 18.

An oscillator 19 generates an oscillated signal VCR having a carrier wave frequency and supplies it to a phase shifter 20. The phase shifter 20 generates quadrature signals VI-CR and VQ-CR each having a phase difference of about 90° with respect to the oscillated signal VCR and supplies the signal VI-CR to the frequency converter 17 and the signal VQ-CR to the frequency converter 18.

The frequency converter 17 multiplies the intermediate frequency signal RIFs and the signal VI-CR to down-convert the intermediate frequency signal RIFs so that a baseband demodulated signal PI may be generated and supplied to a low-pass filter 21. Further, the frequency converter 18 multiplies the intermediate frequency RIFs and the signal VQ-CR to down-convert the intermediate frequency signal RIFs so that a baseband demodulated signal PQ may be generated and supplied to a low-pass filter 22.

The low-pass filter 21 extracts a signal having a desired baseband component from the demodulated signal PI and supplies it as a demodulated signal PIs to an A/D converter 23. Similarly, the low-pass filter 22 extracts a signal having a desired baseband component from the demodulated signal PQ and supplies it as a demodulated signal PQs to an A/D converter 24. It is to be noted that the low-pass filters 21 and 22 have a function of an anti-aliasing filter in order to prevent aliasing from occurring.

The A/D converter 23 converts the demodulated signal PIs into received digital data DI by sampling it with a clock signal CKa supplied from a clock signal generation portion 25 and supplies the data DI to a signal-processing portion 30. The A/D converter 24, on the other hand, converts the demodulated signal PQs into received digital data DQ by sampling it with the clock signal CKa supplied from the clock signal generation portion 25 and supplies the data DQ to the signal-processing portion 30. The signal-processing portion 30 performs error detection/correction processing etc. using the received data DI and DQ, to generate correct received data.

However, in the above-described receiving set, to obtain the demodulated signals PI and PQ from the intermediate frequency signal RIFs, it is necessary to have an oscillator for generating the oscillated signal VCR, a phase shifter for generating the signals VI-CR and VQ-CR each having a phase difference of about 90° with respect to the oscillated signal VCR, a frequency converter for multiplying each of the signals VI-CR and VQ-CR and the intermediate frequency signal RIFs, etc., so that the demodulated signal cannot be obtained by a simple circuit configuration.

Further, if, for example, a Gm-C type filter is used as the low-pass filters 21 and 22 for transformation into an integrated circuit (IC), 1/f noise has large influence because the low-pass filters 21 and 22 extract a baseband component, that is, a low-frequency signal. Further, since they do not have a large dynamic range, there may be such a case that it is necessary to have an attenuator for attenuating a signal to be input to the low-pass filters 21 and 22 or an amplifier for amplifying a signal output from the low-pass filters 21 and 22.

Furthermore, as the receiving set, such a direct conversion type receiving set is known as to directly generate the demodulated signals PI and PQ from the received signal RB by supplying the received signal RB to two frequency converters and further supplying one of these frequency converter with a signal VI-CR' having a local-oscillated frequency close to a frequency of the received signal RB and the other converter with a signal VQ-CR' having a similar local-oscillated frequency.

Such a direct conversion type receiving set needs to have two frequency converters for handling high frequencies, so that it requires large power dissipation and so is not preferable for a portable receiving set. Further, the frequency of the received signal RB and the local-oscillated frequency are close to each other, so that a signal of the local-oscillated frequency is liable to enter the received signal RB; to remove this influence, an order number of the filter or Q of characteristics of the filter must be designed to be high. Furthermore, if a high-order filter is used or a filter's Q is designed to high, the filter portion occupies a large chip area of an IC, if put in it, thereby increasing costs.

DISCLOSURE OF THE INVENTION

It is an object of the present invention to provide a demodulation circuit and a receiving set that can easily obtain a good demodulated signal with a simple configuration.

A demodulation circuit in accordance with the invention comprises sampling means for sampling a modulated signal, signal synthesis means for synthesizing and holding the signals sampled by the sampling means, polarity adjustment means for matching polarities of the signals synthesized by the signal synthesis means, with each other, and demodulation control means for driving the sampling means to sample the modulated signal at a frequency of the modulated signal multiplied by "1/(m+0.25)" or "1/(m+0.75)" (m: 0 or natural number) and also driving the signal synthesis means to synthesize and hold the signals having phase difference "π" from each other to allow a demodulated signal to be generated by the signal synthesis means.

It also comprises sampling means for sampling a modulated signal, switched capacitor filter means, signal generation means for generating a signal on which the switched capacitor filter means performs filter processing, based on the signal sampled by the sampling means, and demodulation control means for driving the sampling means to sample the modulated signal at a frequency of the modulated signal multiplied by "1/(m+0.25)" or "1/(m+0.75)" (m: 0 or natural number), to supply a signal to undergo the filter processing based on a signal having phase difference "π" from the sampled signal, from the signal generation means to the switched capacitor filter means, thereby allowing a demodulated signal to be output from the switched capacitor filter means.

A receiving set in accordance with the invention comprises sampling means for sampling a received signal or an intermediate frequency signal generated on the basis of the received signal, signal synthesis means for synthesizing and holding the signals sampled by the sampling means, polarity adjustment means for matching polarities of the signals synthesized by the signal synthesis means, with each other, and demodulation control means for driving the sampling means to sample the received signal or the intermediate frequency signal at a frequency of the received signal or the intermediate frequency signal multiplied by "1/(m+0.25)" or "1/(m+0.75)" (m: 0 or natural number) and also driving the signal synthesis means to synthesize and hold the signals having phase difference "π" from each other, thereby allowing a demodulated signal of the received signal or the intermediate frequency signal to be generated by the signal synthesis means.

It also comprises sampling means for sampling a received signal or an intermediate frequency signal, switched capacitor filter means, signal generation means for generating a signal on which the switched capacitor filter means performs filter processing, based on the signal sampled by the sampling means, and demodulation control means for driving the sampling means to sample the modulated signal at a frequency of the modulated signal multiplied by "1/(m+0.25)" or "1/(m+0.75)" (m: 0 or natural number), to supply a signal to undergo the filter processing based on a signal having phase difference "π" from the sampled signal, from the signal generation means to the switched capacitor filter means, thereby allowing a demodulated signal to be output from the switched capacitor filter means.

In the present invention, a received signal or a modulated signal such as an intermediate frequency signal is sampled at its frequency multiplied by "1/(m+0.25)" or "1/(m+0.75)" (m: 0 or a natural number), to generate signals having phase differences of "0", "π/2", "π", and "3π/2"; then polarities of the signals having a phase difference of "π", that is, those of the signals with phase differences "0" and "π" are matched with each other to synthesize them into one demodulated quadrature signal. Further, the polarities of the signals having phase differences "π/2" and "3π/2" are matched with each other to synthesize them into the other demodulated quadrature signal. In this case, to match the polarities and then synthesize the signals, signals whose polarities are inverted are generated before sampling, to synthesize the obtained signals. Alternatively, the signals obtained by sampling are synthesized after their polarities are inverted. Further, generating a signal to be used in filtering processing by using a sampled signal and supplying this generated signal to a switched capacitor filter allows a demodulated signal, which is filtered, to be generated.

According to the present invention, a received signal or a modulated signal such as an intermediate frequency signal is sampled at its frequency multiplied by "1/(m+0.25)" or "1/(m+0.75)" (m: 0 or a natural number) to match polarities of the obtained signals having a phase difference of "π" and synthesize them, thereby generating a demodulated signal. It is thus possible to easily generate a demodulated signal by a simple configuration. Further, by increasing a value of "m", the demodulated signal can be generated at a lower sampling frequency.

Further, a received signal or a modulated signal such as an intermediate frequency signal is sampled at its frequency multiplied by "1/(m+0.25)" or "1/(m+0.75)" (m: 0 or a natural number), so that a filter processing signal based on a signal having a phase difference of "π" with respect to the sampled signal is generated and supplied to the switched capacitor filter means so that this switched capacitor filter means may output a demodulated signal. Therefore, a demodulation circuit having a filter function can be constituted of a differential amplifier, a capacitor and a switch circuit and so can easily be put into an IC. Further, even if a capacitance of the capacitor put into the IC fluctuates, desired filter characteristics can be obtained by adjusting a switching frequency, thereby easily generating a good demodulated signal. Further, by constituting a receiving set of this demodulation circuit, a channel filter can be easily put into an IC.

Furthermore, the sampling frequency is set to "p times" or "1/p times" (p: a natural number) a switching frequency of the switched capacitor filter means, the switching frequency of the switched capacitor filter means is set to "q times" or "1/q times" (q: a natural number) a clock frequency of the signal conversion means, and the clock frequency of the signal conversion means is set to "r times" (r: a natural number) a symbol rate determined by a modulation scheme employed by the received signal or the intermediate frequency signal. Therefore, a signal having the sampling frequency or the clock frequency has no influence on the intermediate frequency signal etc. Further, this allows an analog circuit to avoid affecting therefrom and also a signal having each of the frequencies to be easily generated.

BEST MODE FOR CARRYING OUT THE INVENTION

Figure 1:
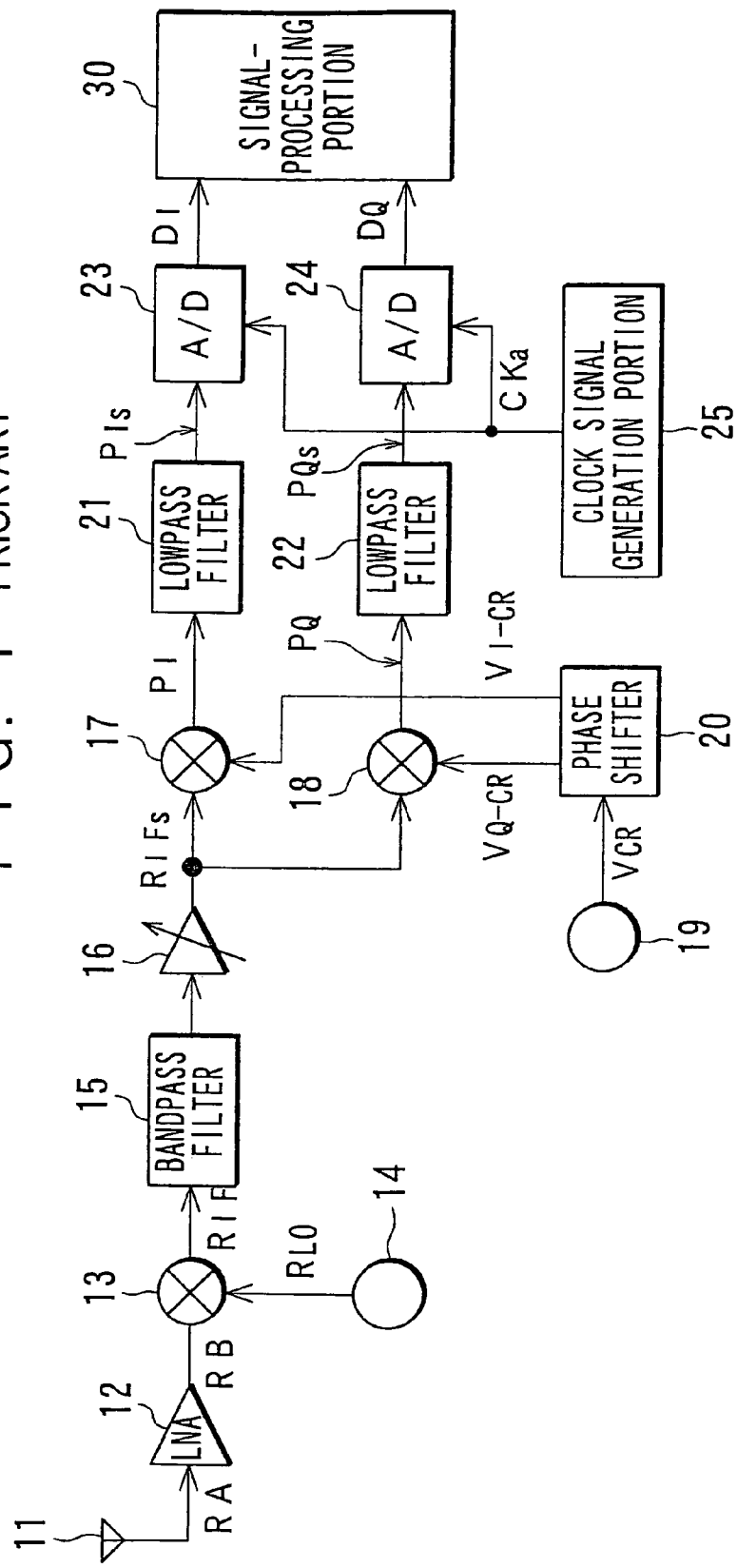
FIG. 1 is a diagram for showing a configuration of a conventional receiving set.
Figure 2:
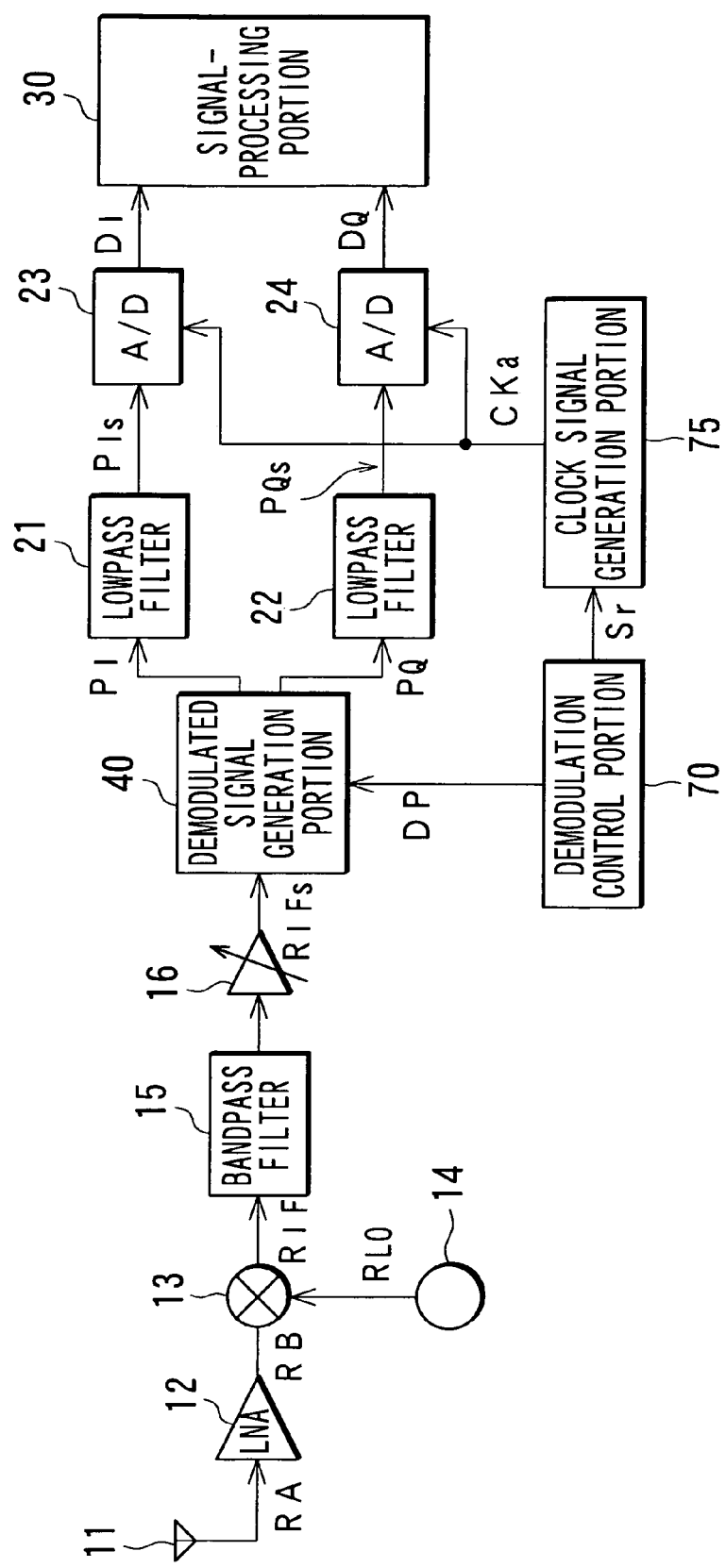
FIG. 2 is a diagram for showing a configuration of a receiving set related to the present invention.

The following will describe an embodiment of the present invention with reference to drawings. FIG. 2 shows a configuration of a receiving set related to the present invention, in which in place of frequency converters 17 and 18, a phase shifter 20, etc. of a conventional receiving set, a demodulated signal generation portion 40 and a demodulation control portion 70 constitutes a demodulation circuit.

A signal RA received by an antenna 11 is supplied to a low-noise amplifier 12. The low-noise amplifier 12 amplifies the signal RA and supplies it as a received signal RB to a frequency converter 13. The frequency converter 13 is supplied with a signal RL0 having a local-oscillated frequency from an oscillator 14 and so multiplies the received signal RB and the signal RL0 to down-convert the received signal RB so that an intermediate frequency signal RIF may be generated and supplied to a bandpass filter 15.

The bandpass filter 15 limits a band of the intermediate frequency signal RIF and supplies it to a variable gain amplifier 16. The variable gain amplifier 16 amplifies the signal supplied from the bandpass filter 15 to a predetermined signal level and supplies it as an intermediate frequency signal RIFs to a demodulated signal generation portion 40.

The demodulation control portion 70 generates a plurality of signals for driving the demodulated signal generation portion 40 and supplies them to this demodulated signal generation portion 40. It is to be noted that the plurality of signals is put together into a control signal DP for illustration.

The demodulated signal generation portion 40 samples the intermediate frequency signal RIFs based on the control signal DP, to generate demodulated signals PI and PQ from it and supply the demodulated signal PI to a low-pass filter 21 and the demodulated signal PQ to a low-pass filter 22.

The low-pass filter 21 extracts a signal having a desired baseband component from the demodulated signal PI and supplies it as a demodulated signal PIs to an A/D converter 23. Similarly, the low-pass filter 22 extracts a signal having a desired baseband component from the demodulated signal PQ and supplies it as a demodulated signal PQs to an A/D converter 24. It is to be noted that each of the low-pass filters 21 and 22 also has an anti-aliasing filter function to prevent aliasing from occurring on the A/D converters 23 and 24.

A clock signal generation portion 75 converts a frequency of a reference signal Sr supplied from the demodulation control portion 70, to generate a clock signal CKa synchronized with the reference signal Sr and supply it to the A/D converters 23 and 24.

The A/D converter 23 samples the demodulated signal PIs with the clock signal CKa supplied from the clock signal generation portion 75 to convert it into digital received data DI and supplies the data DI to a signal-processing portion 30. The A/D converter 24, on the other hand, samples the demodulated signal PQs with the clock signal CKa supplied from the clock signal generation portion 75 to convert it into digital received data DQ and supplies the data DQ to the signal-processing portion 30. The signal-processing portion 30 performs error detection/correction processing etc. on items of the received data DI and DQ, to generate correct received data.

The following will describe the demodulated signal generation portion 40. To sample a modulated signal Sin modulated by using a quadrature carrier wave in order to obtain the demodulated signals PI and PQ, a sampling frequency Fs is set to "1/(m+0.25) times" or "1/(m+0.75) times" (m: 0 or a natural number) a frequency of the modulated signal.

Figure 3:
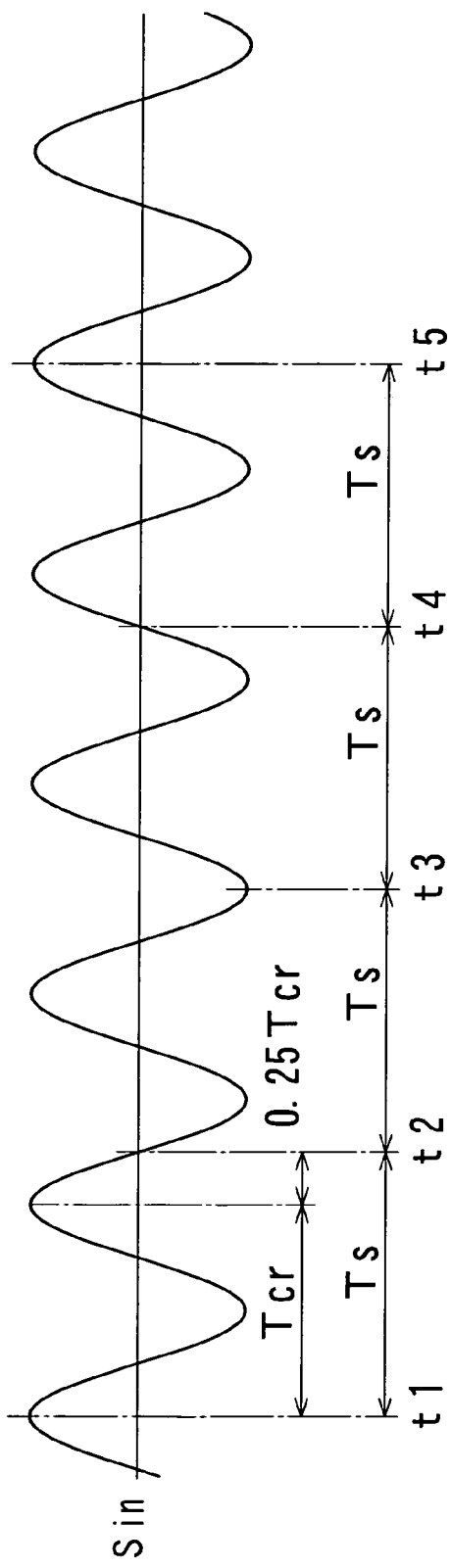
FIG. 3 is an explanatory diagram of a basic principle of a demodulation circuit.

FIG. 3 shows sampling positions in a case where the sampling frequency Fs is set to "1/(1+0.25) times" the frequency of the modulated signal. In the figure, "Ts" indicates a sampling period and "Tcr" indicates one period of the carrier wave. In this case, if it is supposed that a first sampling position (time point t1) is used as a reference, second sampling position (time point t2) has a phase difference of "π/2" with respect to the first sampling position, a third sampling position (time point t3) has a phase difference of "π" with respect to the first sampling position, a fourth sampling position (time point t4) has a phase difference of "3π/2" with respect to the first sampling position, a fifth sampling position (time point t5) has a phase difference of "0", and so on. It is to be noted that this relationship in phase difference holds true not only with the case of "m=1" but also with the case of "m=0" or (m=a natural number).

If it is here supposed that a signal at the first sampling position indicates a signal level of the demodulated signal PI, a signal having phase difference "π/2" at the second sampling position indicates a signal level of the demodulated signal PQ. A signal with phase difference "π" at the third sampling position has an inversed polarity of a signal level of the demodulated signal PI and a signal with phase difference "3π/2" at the fourth sampling position has an inversed polarity of a signal level of the demodulated signal PQ. Further, a signal at the fifth sampling position indicates the signal level of the demodulated signal PI.

Further, in a case where the sampling frequency Fs is set to "1+(m+0.75) times" the frequency of the modulated signal, if it is supposed that the first sampling position is used as a reference, the second sampling position has phase difference "3π/2" with respect to the first sampling position, the third sampling position has phase difference "π" with respect to the first sampling position, the fourth sampling position has phase difference "π/2" with respect to the first sampling position, the fifth sampling position has phase difference "0", and so on.

Therefore, by selecting the signal having phase difference "π" and inverting its polarity every second sampling, the demodulated signals PI and PQ can be generated. For example, by selecting the signal with phase difference π and sampling it at time points t1, t3, t5, t7, . . . and inverting polarities of the signals at time points t3, t7, . . . , these sampled signal at the time points indicate levels of the demodulated signal PI, respectively. Similarly, by selecting the signal with phase difference π and sampling it at time points t2, t4, t6, t8, . . . and inverting polarities of the signals at time points t4, t8, . . . , these sampled signal at the time points indicate levels of the demodulated signal PQ, respectively.

In such a manner, by sampling a modulated signal at a frequency set to "1/(m+0.25) times" or "1/(m+0.75) times" (m: 0 or a natural number) a frequency of this modulated signal and matching polarities of these sampled signals by using a signal having phase difference "π" and then synthesizing them, a demodulated signal can be generated easily. Further, by increasing a value of "m", the demodulated signals PI and PQ can be generated at a low sampling frequency.

Figure 4:
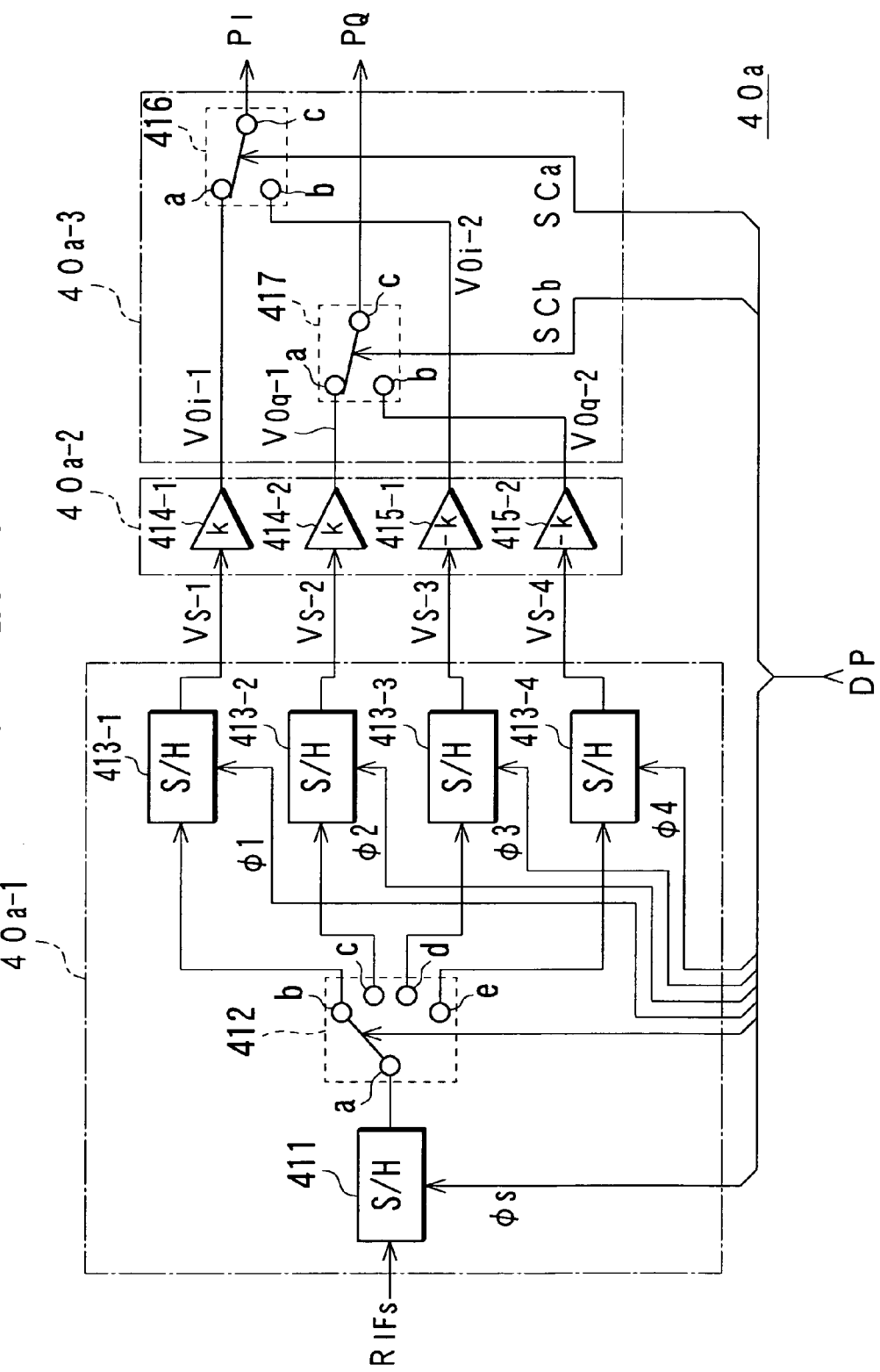
FIG. 4 is a diagram for showing a first configuration of a demodulated signal generation portion.

FIG. 4 shows a first configuration of a demodulated signal generation portion. This demodulated signal generation portion 40a samples, at a sampling block 40a-1, the intermediate frequency signals RIFs at the sampling frequency Fs to generate signals having phase differences "0", "π/2", "1", and "3π/2". Then, a polarity adjustment block 40a-2 inverts polarities of the signals having phase differences "π" and "3π/2", respectively and a signal synthesis block 40a-3 synthesizes the signal with phase difference "0" and the inversed-polarity signal with phase difference "π" to obtain the demodulated signal PI and also synthesizes the signal with phase difference "π/2" and the inversed-polarity signal with phase difference "3π/2" to obtain the demodulated signal PQ.

The intermediate frequency signal RIFs is supplied to a sample/hold circuit 411 in the sampling block 40a-1. The sample/hold circuit 411 samples the intermediate frequency signal RIFs based on a control signal φs, which is one of the control signals DP supplied from the demodulation control portion 70. This control signal φs has the sampling frequency Fs. Further, the signal sampled by the sample/hold circuit 411 is supplied as a sample/hold output signal Vs to a movable terminal "a" of a signal switch circuit 412.

A terminal "b" of the signal switch circuit 412 connects to a sample/hold circuit 413-1 and a terminal "c" connects to a sample/hold circuit 413-2. Further, terminals "d" and "e" connect to sample/hold circuits 413-3 and 413-4, respectively. The signal switch circuit 412 switches the movable terminal "a" to any one of the terminals "b", "c", "d", and "e" based on a switch signal SS supplied from the demodulation control portion 70. For example, if the sampling frequency Fs is multiplied by "1+(m+0.25)", it switches the movable terminal "a" to the terminals "b", "c", "d", "e", "b", "c", . . . , in this order repeatedly. If the sampling frequency Fs is multiplied by "1/(m+0.75)", an order of the signals having phase differences "π/2" and "3π/2" respectively is opposite to that in the case of multiplication by "1/(m+0.25)". Therefore, the movable terminal "a" is switched to the terminals "b", "e", "d", "c", "b", "e", . . . , in this order repeatedly.

Based on a control signal φ1, which is one of the control signals DP supplied from the demodulation control portion 70, the sample/hold circuit 413-1 holds the sample/hold output signal Vs supplied via the signal switch circuit 412. Similarly, based on a control signal φ2, which is one of the control signals DP supplied from the demodulation control portion 70, the sample/hold circuit 413-2 holds the sample/hold output signal Vs which has phase difference "π/2" with respect to the signal held in the sample/hold circuit 413-1. Based on a control signal φ3, which is one of the control signals DP supplied from the demodulation control portion 70, the sample/hold circuit 413-3 holds the sample/hold output signal Vs which has phase difference "π" with respect to the signal held in the sample/hold circuit 413-1. Based on a control signal φ4, which is one of the control signals DP supplied from the demodulation control portion 70, the sample/hold circuit 413-4 holds the sample/hold output signal Vs which has phase difference "3π/2" with respect to the signal held in the sample/hold circuit 413-1.

An output signal from the sample/hold circuit 413-1 is supplied as a sample/hold output signal Vs-1 to an in-phase amplifier 414-1 in the polarity adjustment block 40a-2. An output signal from the sample/hold circuit 413-2 is supplied as a sample/hold output signal Vs-2 to an in-phase amplifier 414-2. An output signal from the sample/hold circuit 413-3 is supplied as a sample/hold output signal Vs-3 to a reversed-phase amplifier 415-1. An output signal from the sample/hold circuit 413-4 is supplied as a sample/hold output signal Vs-4 to a reversed-phase amplifier 415-2.

The in-phase amplifier 414-1 amplifies the sample/hold output signal Vs-1 by gain k and supplies it as a signal Voi-1 to a terminal "a" of a signal switch circuit 416. The in-phase amplifier 414-2 amplifies the sample/hold output signal Vs-2 by gain k and supplies it as a signal Voq-1 to a terminal "a" of a signal switch circuit 417. The reversed-phase amplifier 415-1 amplifies the sample/hold output signal Vs-3 by gain −k to match its polarity with that of the signal Voi-1 and supplies it as a signal Voi-2 to a terminal "b" of the signal switch circuit 416. The reversed-phase amplifier 415-2 amplifies the sample/hold output signal Vs-4 by gain −k to match its polarity with that of the signal Voq-1 and supplies it as a signal Voq-2 to a terminal "b" of the signal switch circuit 417.

The signal switch circuit 416 in the signal synthesise block 40a-3 switches its movable terminal "c" to any of its terminals "a" and "b" alternately at half the sampling frequency Fs based on a switch signal SCa, which is one of the control signals DP supplied from the demodulation control portion 70, to synthesise the two signals into one signal and output it as the demodulated signal PI. The signal switch circuit 417, on the other hand, switches its movable terminal "c" to any of its terminals "a" and "b" alternately at half the sampling frequency Fs based on a switch signal SCb supplied from the demodulation control portion 70 to synthesize the two signals into one signal and output it as the demodulated signal PQ. It is to be noted that the switch signals SCa and SCb have a phase difference of one sampling period from each other.

Figure 5:
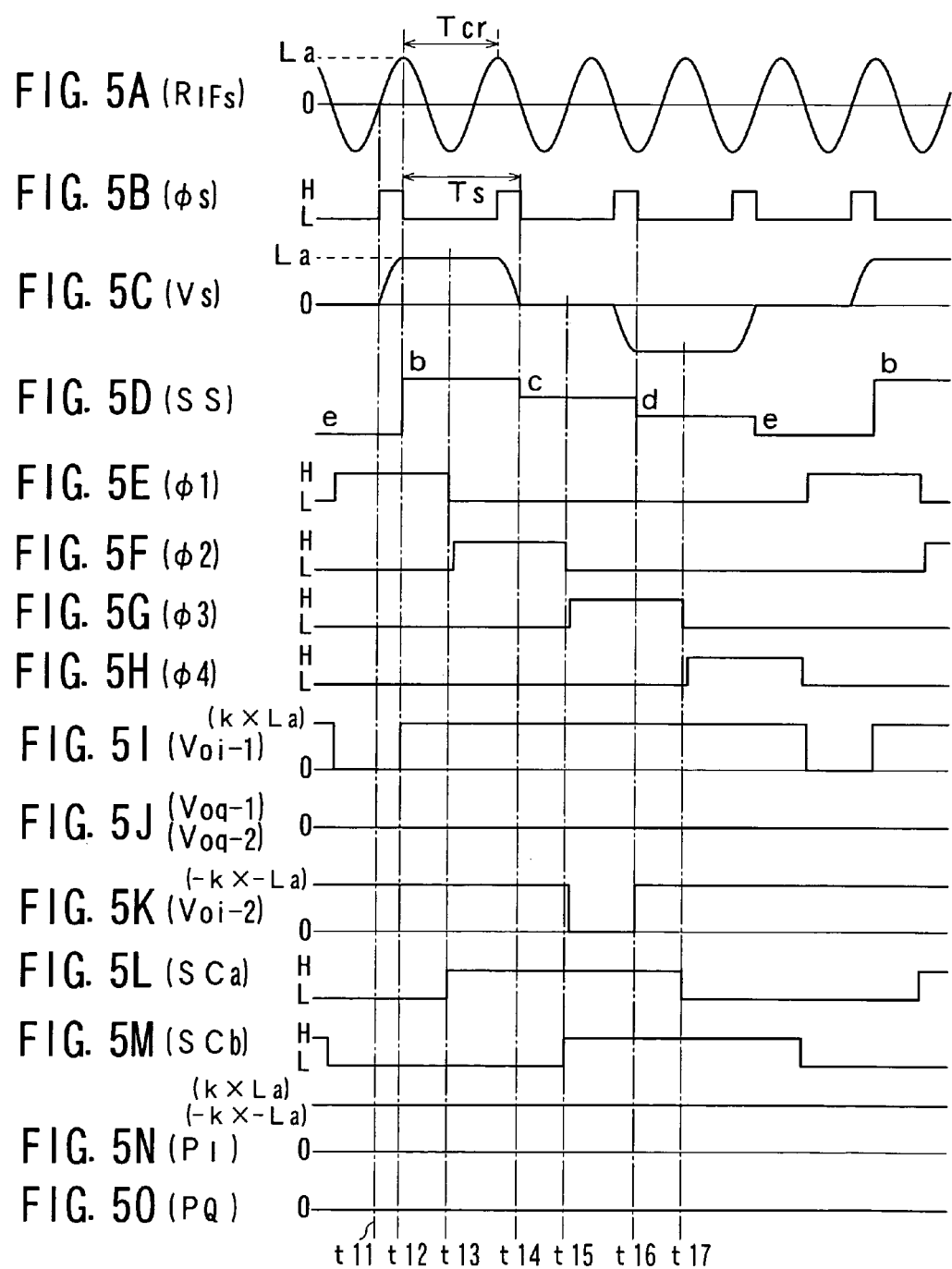
FIGS. 5A, 5B, 5C, 5D, 5E, 5F, 5G, 5H, 5I, 5J, 5K, 5L, 5M, 5N, and 5O are explanatory timing charts of operations of the first configuration of the demodulated signal generation portion.

FIGS. 5A–5O show signals at the various portions of the demodulated signal generation portion 40a. FIG. 5A shows the intermediate frequency signal RIFs and FIG. 5B, the control signal φs. It is to be noted that the figures show the signals in a case where the sampling frequency Fs is multiplied by "1/(1+0.25)".

The sample/hold circuit 411 starts sampling the intermediate frequency signal RFs at a leading edge of the control signal φs and holds a signal level of the intermediate frequency signal RIFs at a trailing edge of the control signal φs, to generate the sample/hold output signal Vs shown in FIG. 5C. For example, it starts sampling the intermediate frequency signal RIFs at time point t11, which is the leading edge of the control signal φs, and holds a signal level La of the intermediate frequency signal RIFs at time point t12, which is the trailing edge of the control signal φs, up to the next leading edge of the control signal φs, to generate the sample/hold output signal Vs. By sampling the signal similarly and so on, the signals held on the basis of the control signal φs have phase differences of "π/2", "π", "3π/2", "0", . . . , respectively in this order if it is supposed that the signal held at time point t12 has a phase difference of "0".

The signal switch circuit 412 distributes the sample/hold output signal Vs to the sample/hold circuits 413-1 through 413-4 based on the switch signal SS shown in FIG. 5D. For example, if the sample/hold circuit 411 enters a hold state at time point t12, it switches the movable terminal "a" to the terminal "b" based on the switch signal SS, to supply the sample/hold output signal Vs to the sample/hold circuit 413-1.

The sample/hold circuit 413-1 samples and holds the supplied sample/hold output signal Vs based on the control signal φ1 shown in FIG. 5E. In this case, while the control signal φ1 is at high level "H", it takes out the signal and, during a lapse of time from time point t13, which is the trailing edge of the control signal φ1, up to its next leading edge, it holds the signal level La of the sample/hold output signal Vs. Therefore, the signal Voi-1 output from the in-phase amplifier 414-1 has signal level (k×La) at time point t12 when the sample/hold output signal Vs is supplied to the sample/hold circuit 413-1, as shown in FIG. 5I.

Furthermore, the signal switch circuit 416 switches the movable terminal "c" to the terminal "a" based on the switch signal SCa shown in FIG. 5L at time point t13 when the sample/hold circuit 413-1 enters the hold state, so that the demodulated signal PI output from the movable terminal "c" has signal level (k×La) as shown in FIG. 5N.

When the control signal φs falls in level at time point t14, the signal switch circuit 412 switches the movable terminal "a" from the terminal "b" to the terminal "c" based on the switch signal SS, to supply the sample/hold output signal Vs to the sample/hold circuit 413-2.

The sample/hold circuit 413-2 samples and holds the supplied sample/hold output signal Vs based on the control signal φ2 shown in FIG. 5F. In this case, while the control signal φ2 is at high level "H", it takes out the signal and, during a lapse of time from time point t15, which is the trailing edge of the control signal φ2, up to its next leading edge, it holds a signal level Lb (Lb=0 in the figure) of the sample/hold output signal Vs. Therefore, the signal Voq-1 output from the in-phase amplifier 414-2 has signal level (k×Lb=0) as shown in FIG. 5J.

Furthermore, the signal switch circuit 417 switches the movable terminal "c" to the terminal "a" based on the switch signal SCb shown in FIG. 5M at time point t15 when the sample/hold circuit 413-1 enters the hold state, so that the demodulated signal PQ output from the movable terminal "c" has signal level (k×Lb=0) as shown in FIG. 5O.

When the control signal φs falls in level at time point t16, the signal switch circuit 412 switches the movable terminal "a" from the terminal "c" to the terminal "d" based on the switch signal SS, to supply the sample/hold output signal Vs to the sample/hold circuit 413-3.

The sample/hold circuit 413-3 samples and holds the supplied sample/hold output signal Vs based on the control signal φ3 shown in FIG. 5G. In this case, while the control signal φ3 is at high level "H", it takes out the signal and, during a lapse of time from time point t17, which is the trailing edge of the control signal φ3, up to its next leading edge, it holds a signal level −La of the sample/hold output signal Vs. Therefore, the signal Voi-2 output from the reversed-phase amplifier 415-1 has signal level (−k×−La) as shown in FIG. 5K.

Furthermore, the signal switch circuit 416 switches the movable terminal "c" to the terminal "b" based on the switch signal SCa shown in FIG. 5L at time point t17 when the sample/hold circuit 413-3 enters the hold state, so that the demodulated signal PI output from the movable terminal "c" has signal level (−k×−La) as shown in FIG. 5N.

When the control signal φs falls in level subsequently, the signal switch circuit 412 switches the movable terminal "a" from the terminal "d" to the terminal "e" based on the switch signal SS, to supply the sample/hold output signal Vs to the sample/hold circuit 413-4. Further, the sample/hold circuit 413-4 samples and holds the supplied sample/hold output signal Vs based on the control signal φ4 shown in FIG. 5H, to hold signal level (−Lb) at the trailing edge of the control signal φ4 as the signal level of the sampling signal up to the next leading edge of the control signal φ4. Therefore, the signal Voq-2 output from the reversed-phase amplifier 415-2 has signal level (−k×−Lb=0) as shown in FIG. 5J. Further, the signal switch circuit 417 switches the movable terminal "c" to the terminal "b" based on the switch signal SCb shown in FIG. 5M at timing when the sample/hold circuit 413-4 enters the hold state, so that the demodulated signal PQ output from the movable terminal "c" has signal level (−k×−Lb=0) as shown in FIG. 5O.

Figure 6:
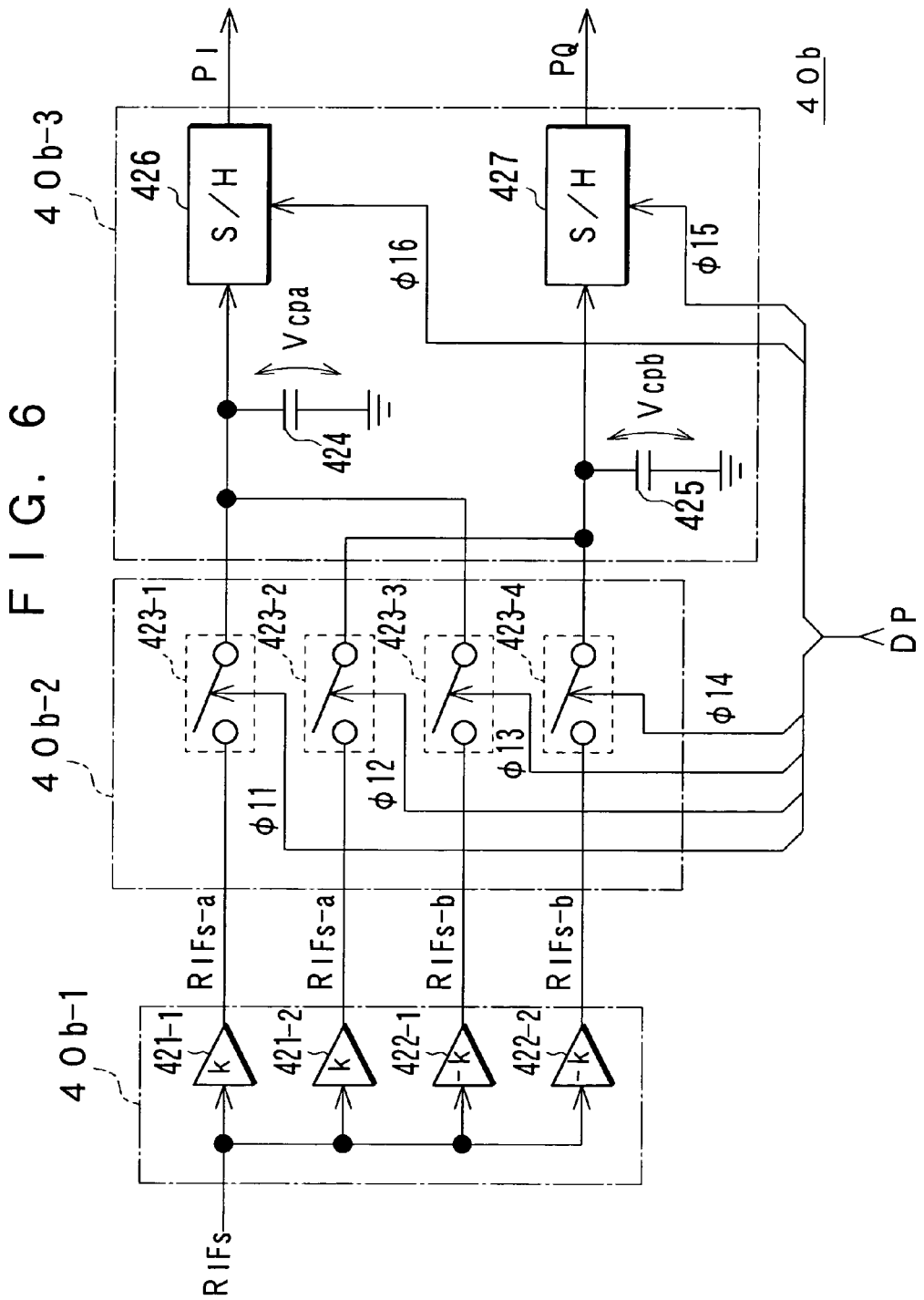
FIG. 6 is a diagram for showing a second configuration of the demodulated signal generation portion.

Next, FIG. 6 shows a second configuration of the demodulated signal generation portion. In contrast to the above-described first configuration in which the intermediate frequency signal RIFs has been sampled and held to then match polarities of the signals to be synthesized, in the second configuration, a demodulated signal generation portion 40b beforehand generates the intermediate frequency signal RIFs whose polarity is inversed by a polarity adjustment block 40b-1, a sampling block 40b-2 selects the intermediate frequency signal RIFs or the polarity-inversed intermediate frequency signal RIFs and samples and holds it, and then a signal synthesis block 40b-3 synthesizes the resultant sampled and held signals to obtain demodulated signals PI and PQ.

The intermediate frequency signal RIFs is supplied to in-phase amplifiers 421-1 and 421-2 and reversed-phase amplifiers 422-1 and 422-2 in the polarity adjustment block 40b-1. The in-phase amplifier 421-1 amplifies the intermediate frequency signal RIFs by gain k to supply it as a signal RIFs-a to one terminal of a switch circuit 423-1 that constitutes the sampling block 40b-2. Further, the in-phase amplifier 421-2 amplifies the intermediate frequency signal RIFs by gain k to supply it as the signal RIFs-a to one terminal of a switch circuit 423-2. The reversed-phase amplifier 422-1 amplifies the intermediate frequency signal RIFs by gain −k to inverse its polarity and supply it as a signal RIFs-b to one terminal of a switch circuit 423-3. Further, the reversed-phase amplifier 422-2 amplifies the intermediate frequency signal RIFs by gain −k to inverse its polarity and supply it as the signal RIFs-b to one terminal of a switch circuit 423-4. It is to be noted that the switch circuit 423 is to come in, for example, a transfer gate in a case where the demodulated signal generation portion 40b is transformed into an IC. This holds true also with later-described switch circuits.

The other terminals of the switch circuits 423-1 and 423-3 respectively connect one terminal of a capacitor 424 and a sample/hold circuit 426 that constitute the signal synthesis block 40b-3. The other terminals of the switch circuits 423-2 and 423-4 connect one terminal of a capacitor 425 and a sample/hold circuit 427 respectively. The other terminals of the capacitors 424 and 425 are connected to the ground.

The switch circuit 423-1 makes the terminals conductive based on a control signal φ11, which is one of the control signals DP from the demodulation control portion 70, to charge the capacitor 424. The switch circuit 423-2 renders the terminals conductive based on a control signal φ12, which is one of the control signals DP from the demodulation control portion 70, to charge the capacitor 425. The switch circuit 423-3 renders the terminals conductive based on a control signal φ13, which is one of the control signals DP from the demodulation control portion 70, to charge the capacitor 424. The switch circuit 423-4 renders the terminals conductive based on a control signal φ14, which is one of the control signals DP from the demodulation control portion 70, to charge the capacitor 425.

The control signals φ11–φ14 each switch only one of the switch circuits 423-1 through 423-4 to make it conductive and set a frequency of timing to make the switch non-conductive to the frequency of the intermediate frequency signal RIFs multiplied by "1/(m+0.25)" or "1/(m+0.75)" (m: 0 or natural number). It is to be noted that if the frequency is multiplied by "1/(m+0.25)", the switch circuit 423-2 is made non-conductive at phase difference "π/2" with respect to timing to make the switch 423-1 non-conductive. Further, the switch circuit 423-3 is made non-conductive at phase difference "π" and the switch circuit 423-4 is made non-conductive at phase difference "3π/2".

An inter-terminal voltage Vcpa across the capacitor 424 is held at a level that corresponds to a signal level of the intermediate frequency signal RIFs when the switch circuit 423-1 or 423-3 is made non-conductive, during a lapse of time from a moment when it is made non-conductive up to a moment when it is made conductive next. Similarly, an inter-terminal voltage Vcpb across the capacitor 425 is held at a level that corresponds to a signal level of the intermediate frequency signal RIFs when the switch circuit 423-2 or 423-4 is made non-conductive, during a lapse of time from a moment when it is made non-conductive up to a moment when it is made conductive next.

The sample/hold circuit 426 samples and holds a voltage held in the capacitor 424 and outputs it as the demodulated signal PI based on a control signal φ16, which is one of the control signals DP from the demodulation control portion 70. The sample/hold circuit 427, on the other hand, samples and holds a voltage held in the capacitor 425 and outputs it as the demodulated signal PQ based on a control signal φ15, which is one of the control signals DP from the demodulation control portion 70.

Figure 7:
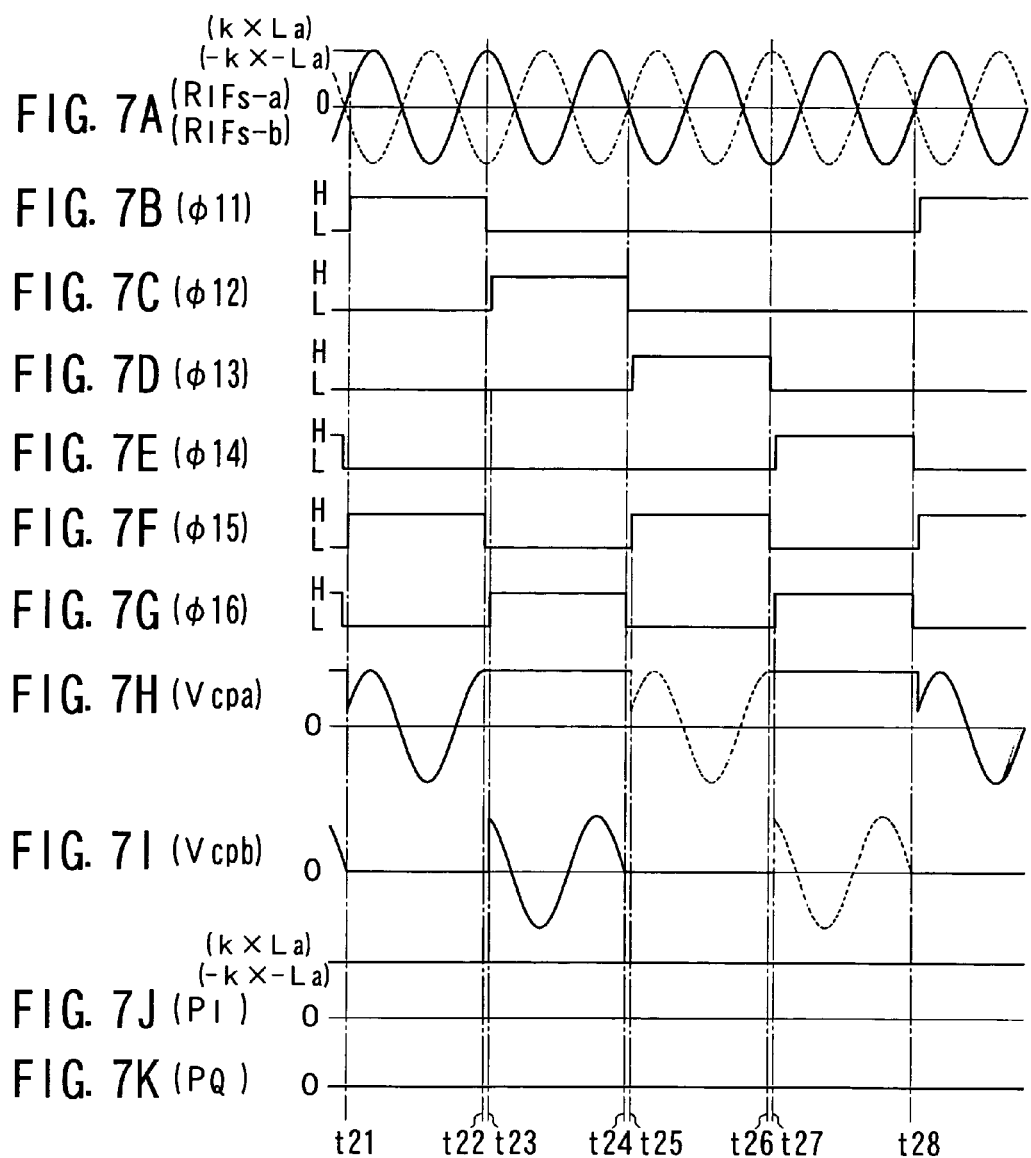
FIGS. 7A, 7B, 7C, 7D, 7E, 7F, 7G, 7H, 7I, 7J, and 7K are explanatory timing charts of operations of the second configuration of the demodulated signal generation portion.

FIGS. 7A–7K show signals at the various portions in the demodulated signal generation portion 40b. FIG. 7A show the signal RIFs-a (solid line) output from the in-phase amplifier 421-1 or 421-2 and the signal RIFs-b (broken line) output from the reversed-phase amplifier 422-1 or 422-2. Further, FIGS. 7B-7G show the control signals φ11–φ16.

When the control signal φ11 is set to high level "H" at time point t21, the switch circuit 423-1 is made conductive, so that the inter-terminal voltage Vcpa across the capacitor 425 becomes equal to a signal level of the signal RIFs-a as shown in FIG. 7H. When the control signal φ11 is set to low level "L" at time point t22, the switch circuit 423-1 is made non-conductive, so that the inter-terminal voltage Vcpa across the capacitor 425 is held at a signal level (k×LA) of the time point t22.

When the control signal φ12 is set to high level "H" at time point t23, the switch circuit 423-2 is made conductive, so that the inter-terminal voltage Vcpb across the capacitor 425 becomes equal to a signal level of the signal RIFs-a as shown in FIG. 7I. Further, when the control signal φ16 is set to high level "H" at time point t23, the sample/hold circuit 426 starts sampling and outputs a signal that corresponds to the inter-terminal voltage Vcpa held in the capacitor 424, as the demodulated signal PI as shown in FIG. 7J.

When the control signal φ12 is set to low level "L" at time point t24, the switch circuit 423-2 is made non-conductive, so that the inter-terminal voltage Vcpb across the capacitor 425 is held at a level (k×Lb=0) of the time point t24. Further, when the control signal φ16 is set to low level "L" at time point t24, the sample/hold circuit 426 holds a signal level (k×La) of the time point t24 and outputs it as the demodulated signal PI continuously.

When the control signal φ13 is set to high level "H" at time point t25, the switch circuit 423-3 is made non-conductive, so that the inter-terminal voltage Vcpa across the capacitor 424 becomes equal to a signal level of the signal RIFs-b as shown in FIG. 7H. Further, when the control signal φ15 is set to high level "H" at time point t25, the sample/hold circuit 427 starts sampling and outputs a signal that corresponds to the inter-terminal voltage Vcpb held in the capacitor 425, as the demodulated signal PQ as shown in FIG. 7K.

When the control signal φ13 is set to low level "L" at time point t26, the switch circuit 423-3 is made non-conductive, so that the inter-terminal voltage Vcpa across the capacitor 424 is held at a level (−k×−La) of the time point t26. Further, when the control signal φ15 is set to low level "L" at time point t26, the sample/hold circuit 427 holds a signal level of the time point t26 and outputs it as the demodulated signal PQ continuously.

When the control signal φ14 is set to high level "H" at time point t27, the switch circuit 423-4 is made conductive, so that the inter-terminal voltage Vcpb across the capacitor 425 becomes equal to a signal level of the signal RIFs-b as shown in FIG. 7I. Further, when the control signal φ16 is set to high level "H" at time point t27, the sample/hold circuit 427 starts sampling and outputs a signal that corresponds to the inter-terminal voltage Vcpa held in the capacitor 424, as the demodulated signal PI.

When the control signal φ14 is set to low level "L" at time point t28, the switch circuit 423-4 is made non-conductive, so that the inter-terminal voltage Vcpb across the capacitor 425 is held at a level (−k×−Lb) of the time point t28. Further, when the control signal φ16 is set to low level "L" at time point t28, the sample/hold circuit 426 holds a signal level of the time point t28 and outputs it as the demodulated signal PI continuously. By performing similar processing, it is possible to generate the intermediate frequency signal RIFs having a inversed polarity so that this intermediate frequency signal RIFs or the polarity-inversed intermediate frequency signal RIFs may be selected and subject to sample/hold processing to obtain the demodulated signal PI or PQ, respectively.

Figure 8:
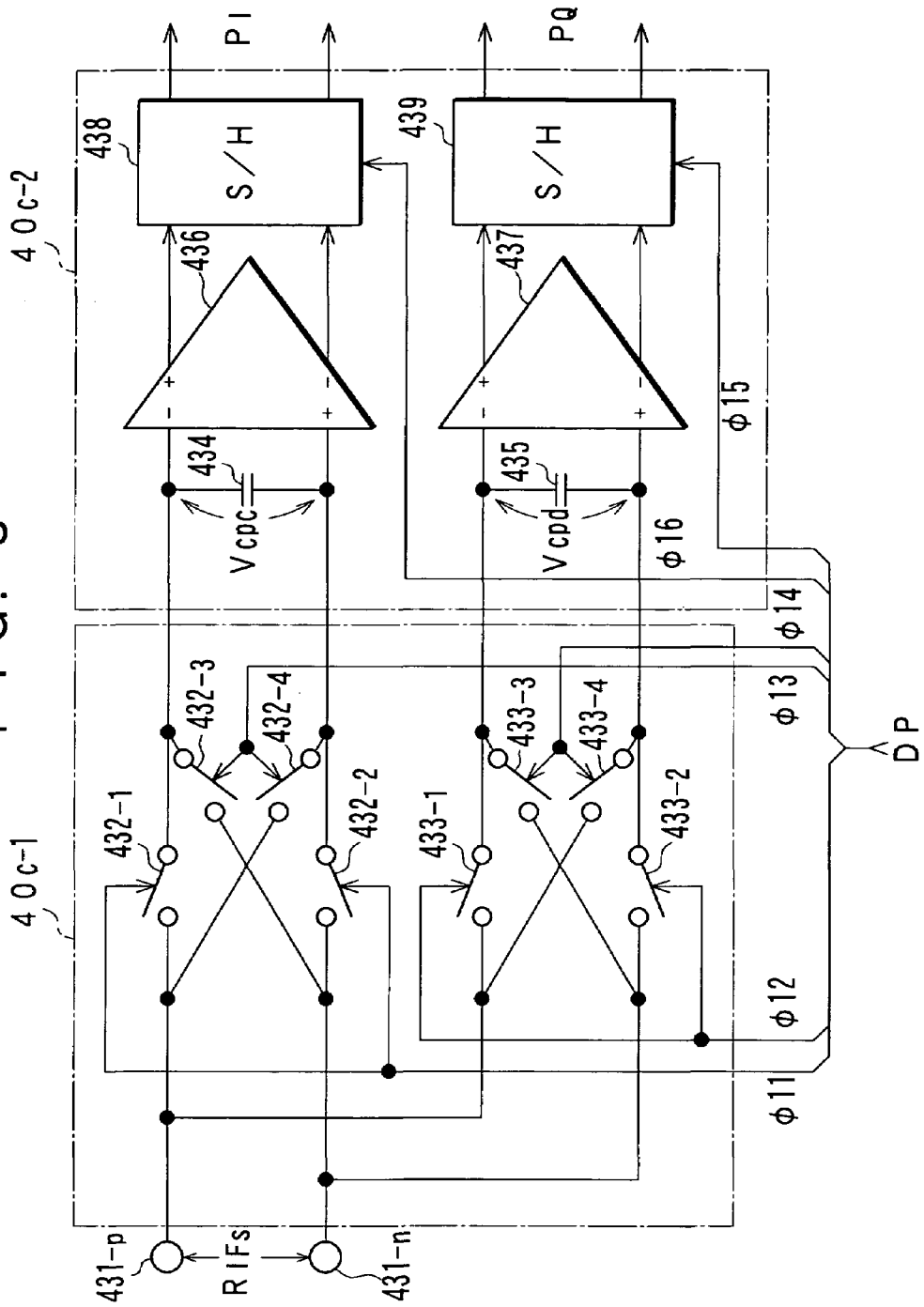
FIG. 8 is a diagram for showing a third configuration of the demodulated signal generation portion.

Originally, an IC often uses a differential amplifier to suppress an influence etc. due to fluctuations in element characteristics or those in characteristic variation owing to temperatures. With this, a demodulated signal generation portion constituted of differential circuits is shows as a third configuration in FIG. 8. In a demodulation signal generation portion 40c having this third configuration, a sampling block 40c-1 performs sampling or inversed-polarity sampling on the intermediate frequency signal RIFs based on the control signal DP from the demodulation control portion 70, so that a signal synthesis block 40c-2 synthesizes the sampled signals to obtain the demodulated signals PI and PQ.

The intermediate frequency signal RIFs is applied between input terminals 431-p and 431-n of the demodulated signal generation portion 40c. The input terminal 431-p is connected through a switch circuit 432-1 in the sampling block 40c-1 to an inverting input terminal of a differential amplifier 436 that constitutes the signal synthesis block 40c-2. Further, it is connected through a switch circuit 432-4 to a non-inverting input terminal of the differential amplifier 436. Furthermore, it is connected through a switch circuit 433-1 to an inverting input terminal of a differential amplifier 437 and also through a switch circuit 433-4 to a non-inverting input terminal of the differential amplifier 437.

The input terminal 431-n is connected through a switch circuit 432-2 to the non-inverting input terminal of the differential amplifier 436 and also through a switch circuit 432-3 to the inverting input terminal of the differential amplifier 436. Further, it is connected through a switch circuit 433-2 to the non-inverting input terminal of the differential amplifier 437 and also through a switch circuit 433-3 to the inverting input terminal of the differential amplifier 437. Furthermore, a capacitor 434 is provided between the input terminals of the differential amplifier 436 and a capacitor 435 is also provided between the input terminals of the differential amplifier 437.

The switch circuits 432-1 and 432-2 are driven by the above-described control signal φ11. Similarly, the switch circuits 433-1 and 433-2 are driven by the control signal φ12 and the switch circuits 432-3 and 432-4, by the control signal φ13. Further, the switch circuits 433-3 and 433-4 are driven by the control signal φ14.

It is to be noted that if the switch circuits 432-3 and 432-4 are made conductive by the control signal φ13, between the input terminals of the differential amplifier 436, the intermediate frequency signal RIFs having a polarity opposite to that in the case where the switch circuits 432-1 and 432-2 are made conductive by the control signal φ11 is supplied. Similarly, if the switch circuits 433-3 and 433-4 are made conductive by the control signal φ14, between the input terminals of the differential amplifier 437, the intermediate frequency signal RIFs having a polarity opposite to that in the case where the switch circuits 433-1 and 433-2 are made conductive by the control signal φ12 is supplied. Therefore, it is possible to supply the intermediate frequency signal to the differential amplifiers 436 and 437 without providing a reversed-phase amplifier in the same way as in the case where the reversed-phase amplifier is provided.

The differential amplifier 436 generates a differential output signal that corresponds to an inter-input terminal voltage, that is, an inter-terminal voltage Vcpc across the capacitor 434 and supplies it from its differential output terminal to a sample/hold circuit 438. Further, the differential amplifier 437 generates a differential output signal that corresponds to an inter-input terminal voltage, that is, an inter-terminal voltage Vcpd across the capacitor 435 and supplies it from its differential output terminal to a sample/hold circuit 439.

Based on the control signal φ16, the sample/hold circuit 438 samples and holds the differential output signal provided from the differential amplifier 436 and outputs the demodulated signal PI as a differential signal. Based on the control signal φ15, the sample/hold circuit 439 samples and holds the differential output signal provided from the differential amplifier 436 and outputs the demodulated signal PQ as a differential signal.

Figure 9:
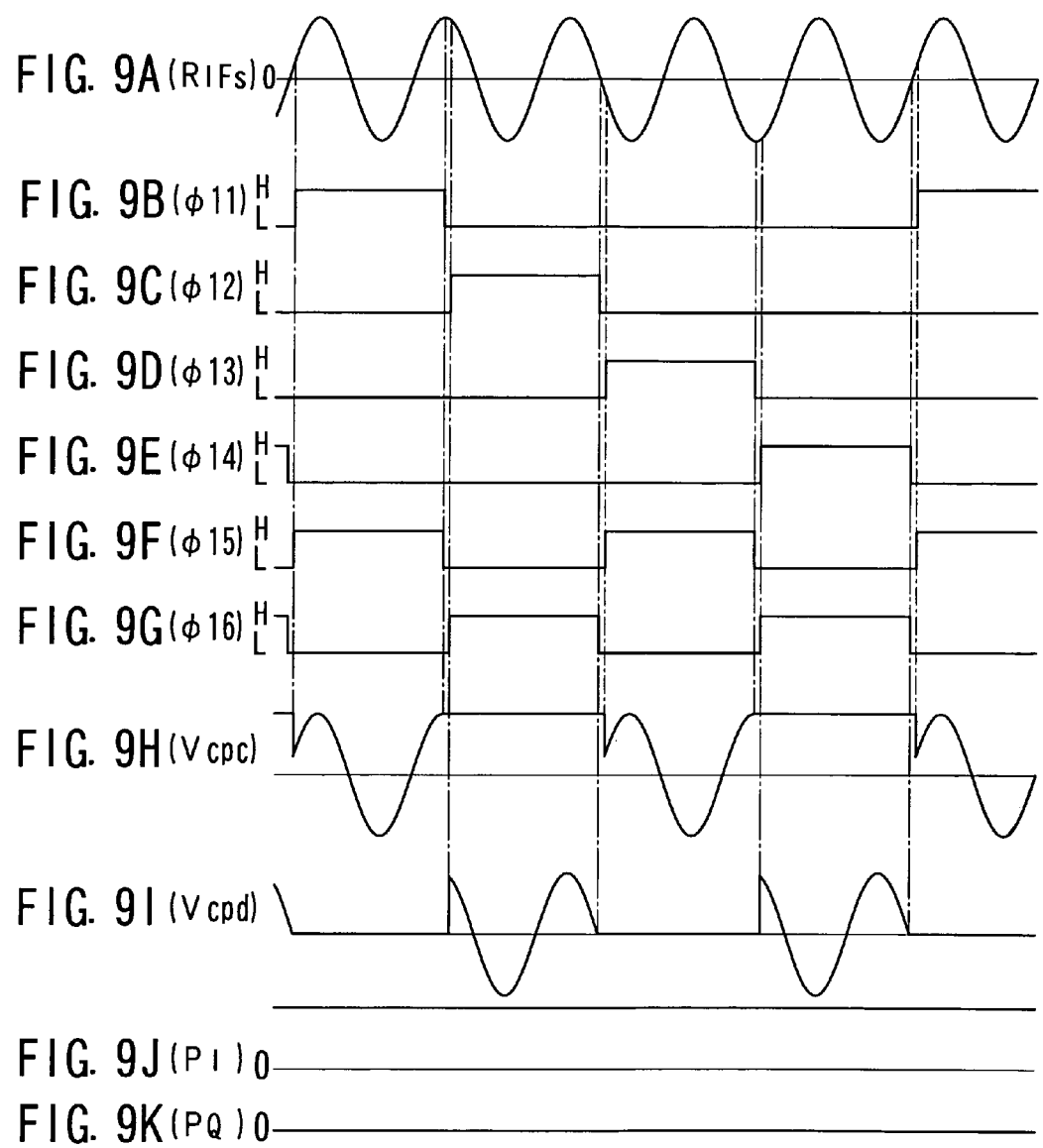
FIGS. 9A, 9B, 9C, 9D, 9E, 9F, 9G, 9H, 9I, 9J, and 9K are explanatory timing charts of operations of the third configuration of the demodulated signal generation portion.

FIGS. 9A–9K show signals at the various portions in the demodulated signal generation portion 40c. FIG. 9A shows the intermediate frequency signal RIFs and FIGS. 9B–9G show the control signals φ11–φ16. In this demodulated signal generation portion 40c, when the control signal φ11 is set to high level "H" to make the switch circuits 432-1 and 432-2 conductive, the inter-terminal voltage Vcpc across the capacitor 434 becomes equal to a signal level of the intermediate frequency signal RIFs as shown in FIG. 9H and is held at a level in the case where they are made non-conductive. Further, when the control signal φ13 is set to high level "H" to make the switch circuits 432-3 and 432-4 conductive, the inter-terminal voltage Vcpc across the capacitor 434 becomes equal to an inversed-polarity signal level of the intermediate frequency signal RIFs and is held at a level in the case where they are made non-conductive. A signal output from the differential amplifier 436 when the inter-terminal voltage Vcpc across this capacitor 434 is held is sampled by the sample/hold circuit 438 based on the control signal φ16, so that the demodulated signal PI shown in FIG. 9J is output as a differential signal from the sample/hold circuit 438.

Further, when the control signal φ12 is set to high level "H" to make the switch circuits 433-1 and 433-2 conductive, the inter-terminal voltage Vcpd across the capacitor 435 becomes equal to a signal level of the intermediate frequency signal RIFs as shown in FIG. 9I and is held at a level in the case where they are made non-conductive. Further, when the control signal φ14 is set to high level "H" to make the switch circuits 433-3 and 433-4 conductive, the inter-terminal voltage Vcpd across the capacitor 435 becomes equal to an inversed-polarity signal level of the intermediate frequency signal RIFs and is held at a level in the case where they are made non-conductive. A signal output from the differential amplifier 437 when the inter-terminal voltage Vcpd across this capacitor 435 is held is sampled by the sample/hold circuit 439 based on the control signal φ15, so that the demodulated signal PQ shown in FIG. 9K is output as a differential signal from the sample/hold circuit 439. It is thus possible to generate the demodulated signals PI and PQ even in a case where a differential circuit is used to constitute the demodulated signal generation portion.

Although in the above demodulated signal generation portions 40a, 40b, and 40c, the intermediate frequency signal RIFs has been used to generate the demodulated signals PI and PQ, it is possible also to sample the received signal RB output from the low-noise amplifier 12, thereby generating the demodulated signals PI and PQ. In this case, in sampling, the sampling frequency Fs is set to a frequency of the received signal multiplied by "1/(m+0.25)" or "1/(m+0.75)" (m: 0 or a natural number) so that polarities of the signals having phase difference "π" may be matched with each other to synthesize them. By thus generating the demodulated signals PI and PQ directly from the received signal RB, it is possible to easily obtain the demodulated signals PI and PQ without using a frequency converter etc. Also, by increasing the value of "m", it is possible to obtain the demodulated signals PI and PQ without performing processing at a high frequency.

Figure 10:
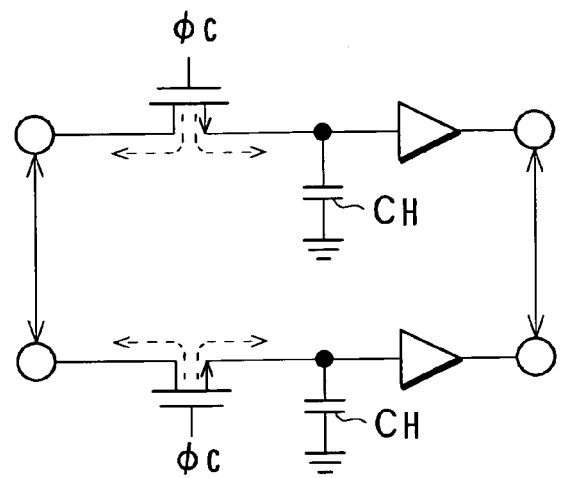
FIG. 10 is an explanatory diagram of charge injection.

It is known that if a capacitor CH is charged through a switch circuit constituted of MOS transistors as shown in FIG. 10, when the transistors are switched from an ON state to an OFF state by a control signal φc, charge in an inversion layer flows toward a signal source side and the capacitor side as indicated by a broken line to charge up the capacitor CH by the charge, that is, so-called charge injection occurs. If, in this case, the charge in the inversion layer flows to the capacitor side, by this inversion layer charge that has flown therein, an inter-terminal voltage fluctuates depending on a capacity of the capacitor CH. Therefore, if, for example, charge injection occurs when the signal level of the intermediate frequency signal RIFs is sampled and held, there may occur a case where the inter-terminal voltage of the capacitor to hold the signal level of the intermediate frequency signal RIFs fails to indicate a voltage level that corresponds to the signal level of the intermediate frequency signal RIFs.

Figure 11:
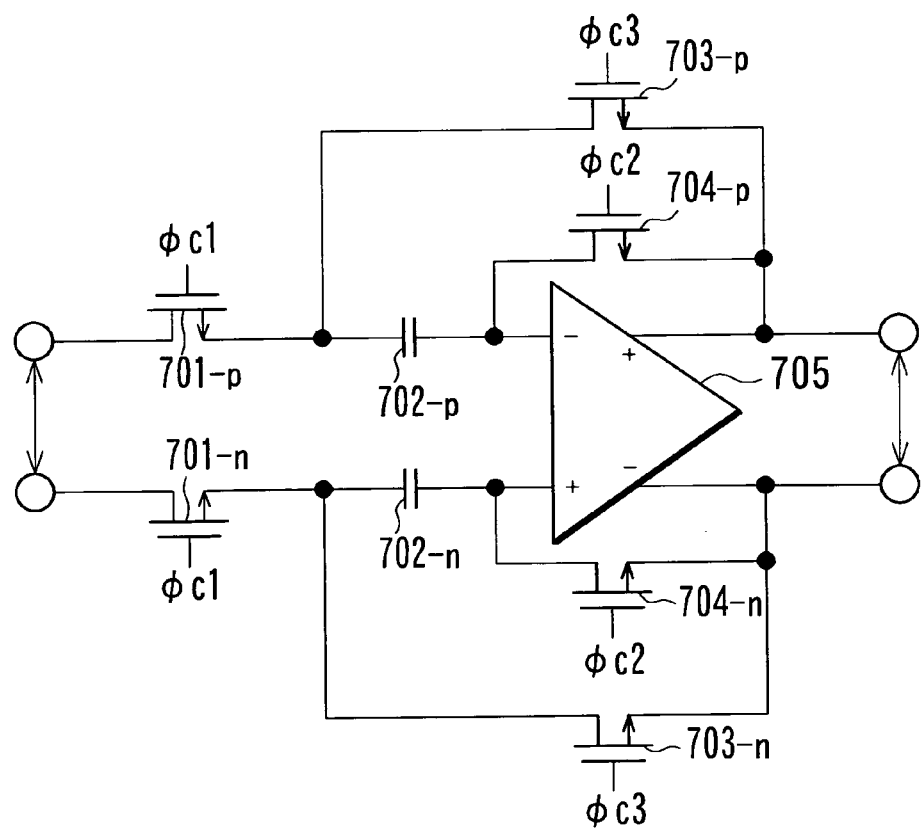
FIG. 11 is a diagram for showing a configuration of a unity gain sample buffer.

Therefore, to avoid such an influence, a unity gain sample buffer such as shown in FIG. 11 is used to sample the intermediate frequency signal RIFs.

In FIG. 11, a source of a transistor 701-p is connected to a terminal of a capacitor 702-p and a drain of a transistor 703-p. The other terminal of the capacitor 702-p is connected to a drain of a transistor 704-p and an inverting input terminal of a differential amplifier 705. Sources of the transistors 703-p and 704-p are connected to a positive-pole side output terminal of the differential amplifier 705.

A source of the transistor 701-n is connected to a terminal of a capacitor 702-n and a drain of a transistor 703-n. The other terminal of the capacitor 702-n is connected to a drain of a transistor 704-n and a non-inverting input terminal of the differential amplifier 705. Sources of the transistors 703-n and 704-n are connected to a negative-pole side output terminal of the differential amplifier 705.

Figure 12:
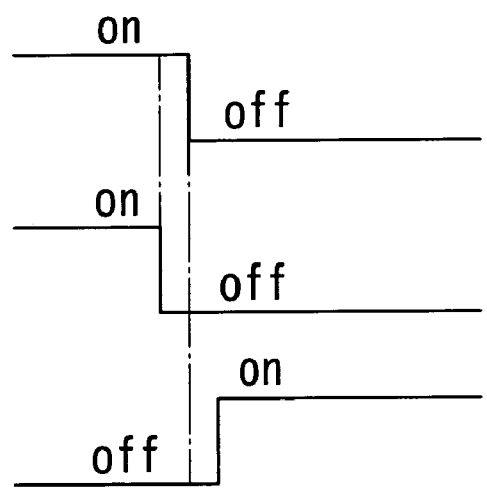
FIGS. 12A, 12B, and 12C are diagrams for showing signals for driving the unity gain sample buffer.

FIGS. 12A–12C show signals for driving the unity gain sample buffer. If the transistors 704-n and 704-p are turned OFF by a control signal φc2 shown in FIG. 12B prior to φc1 for driving the transistors 701-p and 701-n as shown in FIG. 12A, the other terminals of the capacitors 702-p and 702-n are virtually grounded to provide a high-impedance state. Therefore, no charge is injected from the transistors 701-p and 701-n to the capacitors 702-p and 702-n, so that it is possible to obtain from the differential amplifier 705 a correct output signal that corresponds to a signal level of the intermediate frequency signal RIFs. Even if some charge is injected, the input signal for the differential amplifier 705 is not influenced because the other terminals of the capacitors 702-p and 702-n are virtually grounded. Furthermore, a differential operation cancels an effect of charge injection, thus preventing charge injection from affecting the output signal. It is to be noted that a control signal φc3 turns ON the transistors 703-p and 703-n after the transistors 701-p and 701-n are turned OFF by the control signal φc1.

By thus using the unity gain sample buffer, it is possible to obtain the highly accurate demodulated signals PI and PQ free from the influence of charge injection.

It is to be noted that in the above embodiment, the demodulated signals PI and PQ are generated in the demodulated signal generation portion 40a, 40b, or 40c, and the generated demodulated signal PI is supplied to the low-pass filter 21 and the generated demodulated signal PQ is supplied to the low-pass filter 22 so that the low-pass filters 21 and 22 may perform filter processing. If the demodulated signal generation portion 40 and the low-pass filters 21 and 22 are replaced by a demodulated signal generation portion 45 that uses a switched capacitor filter and this demodulated signal generation portion 45 and the demodulation control portion 70 are used to constitute a demodulation circuit, it is possible to further simplify the configuration of the receiving set and easily drive the demodulated signal generation portion 45 and the A/D converters 23 and 24.

Figure 13:
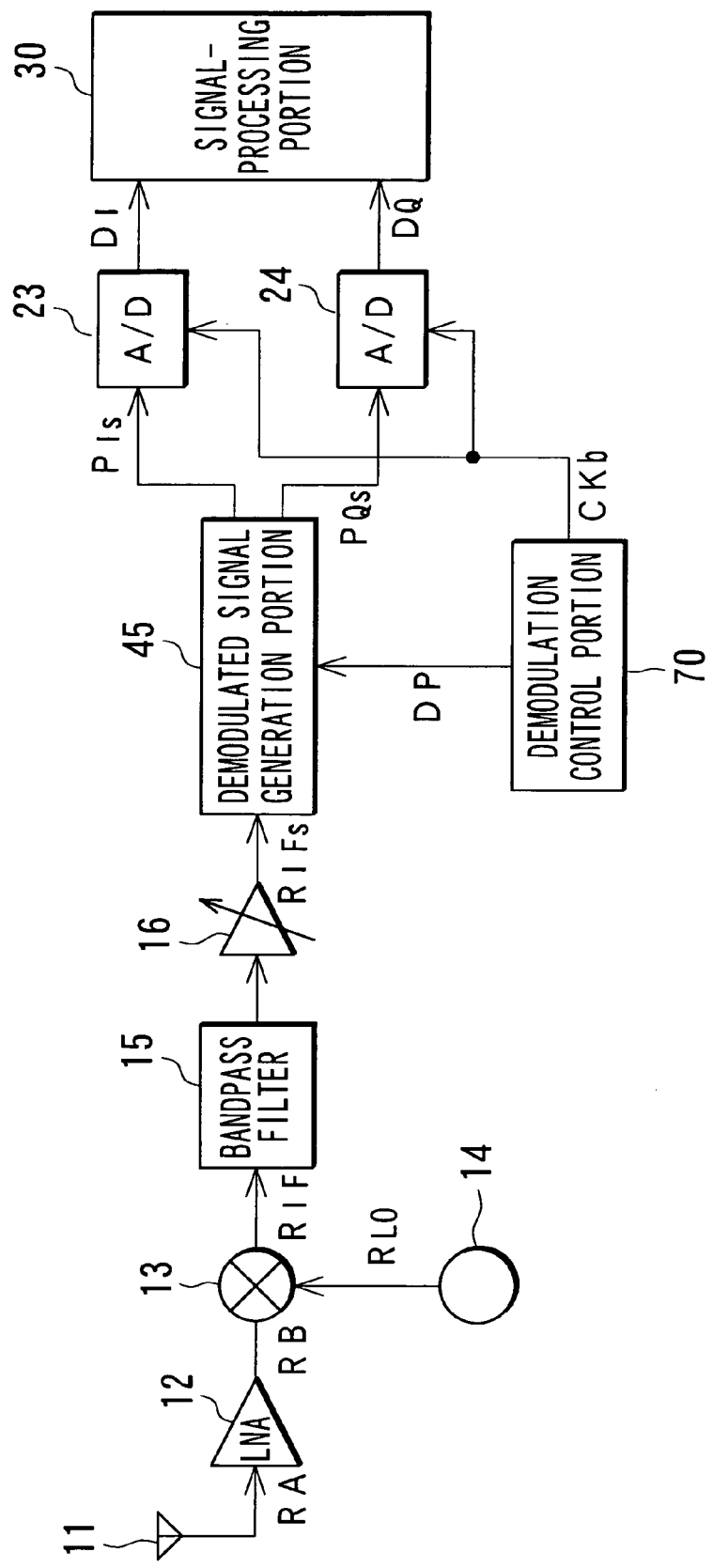
FIG. 13 is a diagram for showing another configuration of the receiving set related to the present invention.

FIG. 13 shows a configuration of the receiving set that uses the demodulated signal generation portion 45. It is to be noted that components of FIG. 13 that correspond to those of FIG. 2 are indicated by the same reference symbols and their detailed explanation will be omitted.

The intermediate frequency signal RIFs is supplied to the demodulated signal generation portion 45 that uses the switched capacitor filter. The demodulated signal generation portion 45 performs sampling of the intermediate frequency signal RIFs, switching of the capacitor, etc. based on the control signal DP from the demodulation control portion 70, to generate a demodulated signal PIs and supply it to the A/D converter 23. Further, it generates a demodulated signal PQs and supplies it to the A/D converter 24. The A/D converters 23 and 24 convert the demodulated signals PIs and PQs into digital signals based on a clock signal CKb supplied from the demodulation control portion 70 to generate items of received data DI and DQ, respectively.

Figure 14:
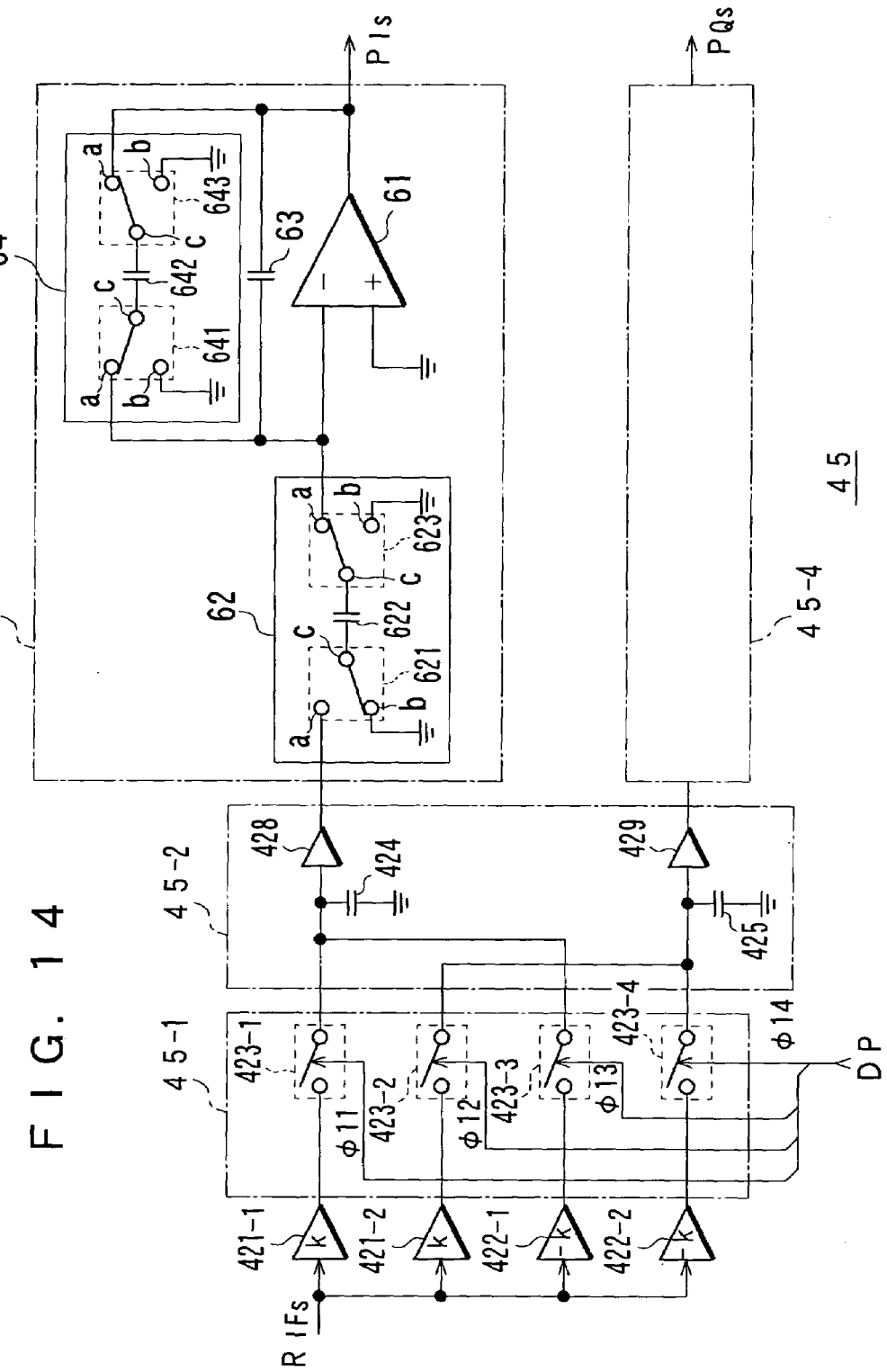
FIG. 14 is an explanatory diagram of a basic principle of the demodulated signal generation portion that uses a switched capacitor filter.

FIG. 14 shows a basic principle of the demodulated signal generation portion 45 that uses the switched capacitor filter.

Similar to the above-described sampling blocks 40a-1, 40b-2, and 40c-1, a sampling block 45-1 in this demodulated signal generation portion 45 samples the intermediate frequency signal RIFs at a sampling frequency Fs obtained by multiplying a frequency of the intermediate frequency signal RIFs by "1/(m+0.25)" or "1/(m+0.75)" (m: 0 or a natural number), to extract signals having phase differences of "0", "π/2", "π", and "3π/2".

A signal generation block 45-2 generates, from the sampling signal, a signal for performing filter processing at the switched capacitor filter based on the signal having phase difference "π". For example, the signal having phase difference "π" is used to charge up the capacitor, so that a signal that corresponds to a inter-terminal voltage across this capacitor is supplied via buffers 428 and 429 to a switched capacitor filter block 45-3.

Although FIG. 14 shows a configuration similar to that of the demodulated signal generation portion 40b, it is not necessary to provide an in-phase amplifier and a reversed-phase amplifier if polarities of the signals based on the sampling signals can be matched with each other when performing filter processing.

The switched capacitor filter block 45-3 is constituted of a switched capacitor filter. The switched capacitor filter replaces, for example, a resistor Rg connected to a inverting input terminal of a differential amplifier 61 by a negative switched capacitor trans-resistance 62 indicated by a solid line. Further, a feedback resistor Rf connected in parallel to an integration capacitor 63 provided between the inverting input terminal and an output terminal of the differential amplifier 61 is replaced by a positive switched capacitor transresistance 64 indicated by a solid line.

In the negative switched capacitor transresistance 62, a capacitor 622 is provided with a switch circuit 621 at its one terminal and with a switch circuit 623 at the other terminal. In this case, if switching a movable terminal "c" of the switch circuit 621 to a terminal "a" to connect one terminal of a capacitor 622 to the signal generation block 45-2, a movable terminal "c" of the switch circuit 623 is switched to a terminal "b" to ground the other terminal of the capacitor 622, thereby charging it. After that, the movable terminal "c" of the switch circuit 621 is switched to a terminal "b" to ground one terminal of the capacitor 622 and the movable terminal "d" of the switch circuit 623 is switched to a terminal "a" to connect the other terminal thereof to the inverting input terminal, thereby supplying stored charge to the inverting input terminal. By switching the switch circuits 621 and 623, the capacitor 622 is driven by switching.

In the positive switched capacitor transresistance 64, a capacitor 642 is provided with a switch circuit 641 at its one terminal and with a switch circuit 643 at the other terminal. In this case, if switching a movable terminal "c" of the switch circuit 641 to a terminal "a" to connect one terminal of a capacitor 642 to the inverting input terminal, a movable terminal "c" of the switch circuit 643 is switched to a terminal "a" to connect the other terminal of the capacitor 642 to the output terminal, thereby charging it. After that, the movable terminal "c" of the switch circuit 641 is switched to a terminal "b" to ground one terminal of the capacitor 642 and the movable terminal "c" of the switch circuit 643 is switched to a terminal "b" to ground the other terminal of the capacitor 642, thereby discharging it. By thus switching the switch circuits 641 and 643, the capacitor 642 is driven by switching.

In this switched capacitor filter, the movable terminals c of the switch circuits 621 and 623 are switched to charge the capacitor 622 with the signal from the signal generation block 45-2. After that, by switching the movable terminals of the switch circuits 621 and 623, charge stored in the capacitor 622 is supplied to the differential amplifier 61. Further, in response to the switching operation of the switch circuits 621 and 623, the switch circuits 641 and 643 are driven by switching. Furthermore, in the negative switched capacitor transresistance 62, charge is transferred on the basis of sampling output signals with phase differences "0" and "π" having phase difference "π" from each other, thus making it possible to obtain from the differential amplifier 61 a demodulated signal on which filter processing has been performed according to low-pass filter characteristics that correspond to a switching frequency, for example, the demodulated signal PIs from which an exo-channel disturbance signal has been removed.

Similar to the switched capacitor filter block 45-3, the switched capacitor filter block 45-4 is also constituted of a switched capacitor filter, to transfer charge based on sampling output signals with phase differences "π/2" and "3π/2" having phase difference "π" from each other, thus making it possible to obtain the demodulated signal PQs on which filter processing has been performed.

By thus using the switched capacitor filter, it is possible to constitute a demodulated signal generation portion having a filter function of a differential amplifier or a capacitor and a switch circuit, thereby facilitating putting them into an IC. Further, when they are put into an IC, even if a capacitance value of the capacitor has fluctuated, by adjusting a switching frequency, desired filter characteristics can be obtained, to generate the demodulated signals PIs and PQs easily.

Figure 15:
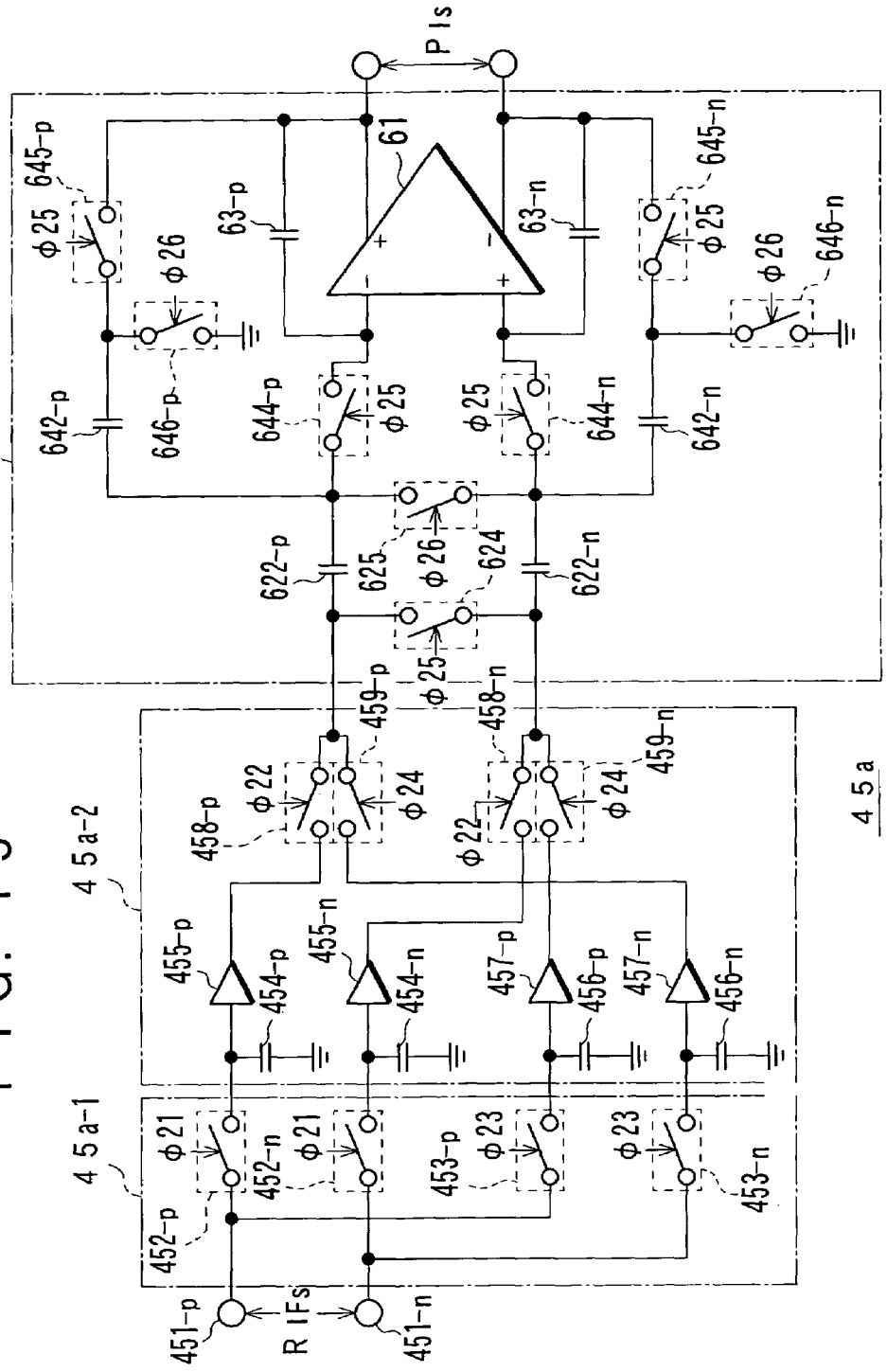
FIG. 15 is a diagram for showing a first configuration of the demodulated signal generation portion that uses the switched capacitor filter.

FIG. 15 shows a first configuration of the demodulated signal generation portion that uses the switched capacitor filter. It is to be noted that only such portions as to generate the demodulated signal PIs are shown in FIG. 15. The intermediate frequency signal RIFs is applied between input terminals 451-p and 451-n. The input terminal 451-p is connected through a switch circuit 452-p in a sampling block 45a-1 to one terminal of a capacitor 454-p that constitutes a signal generation block 45a-2 and through a switch circuit 453-p to one terminal of a capacitor 456-p. Further, the input terminal 451-n is connected through a switch circuit 452-n to one terminal of a capacitor 454-n and through a switch circuit 453-n to one terminal of a capacitor 456-n. The other terminals of the capacitors 454-p, 454-n, 456-p, and 456-n are grounded.

The one terminal of the capacitor 454-p is connected through an amplifier 455-p to one terminal of a switch circuit 458-p and the one terminal of the capacitor 454-n is connected through an amplifier 455-n to one terminal of a switch circuit 458-n. Further, to invert the polarity of the intermediate frequency signal RIFs, the one terminal of the capacitor 456-p is connected through an amplifier 457-p to one terminal of a switch circuit 459-n and one terminal of a capacitor 456-n is connected through an amplifier 457-n to one terminal of a switch circuit 459-p.

The other terminals of the switch circuits 458-p and 459-p are connected to one terminal of a capacitor 622-p and the one terminal of a switch circuit 624 that constitute a switched capacitor filter block 45a-3. The other terminals of the switch circuits 458-n and 459-n are connected to one terminal of a capacitor 622-n and the other terminal of the switch circuit 624.

The other terminal of the capacitor 622-p is connected to one terminal of the switch circuits 625 and 644-p and the capacitor 642-p. It is to be noted that in FIG. 15, the switch circuits 623 and 641 of FIG. 14 are integrated in configuration.

The other terminal of the capacitor 642-p is connected through a switch circuit 645-p to the output terminal of the differential amplifier 61 and also grounded through a switch circuit 646-p. The other terminal of the switch circuit 644-p is connected to the inverting input terminal and also to the positive-pole side output terminal through an integration capacitor 63-p.

The other terminal of the capacitor 622-n is connected to the other terminal of the switch circuit 625 and one terminals of switch circuit 644-n and capacitor 642-n. The other terminal of the switch circuit 642-n is connected through a switch circuit 645-n to the output terminal of the differential amplifier 61 and also grounded through a switch circuit 646-n. The other terminal of the switch circuit 644-n is connected to the non-inverting input terminal and also to a negative-pole side output terminal through an integration capacitor 63-n.

Figure 16:
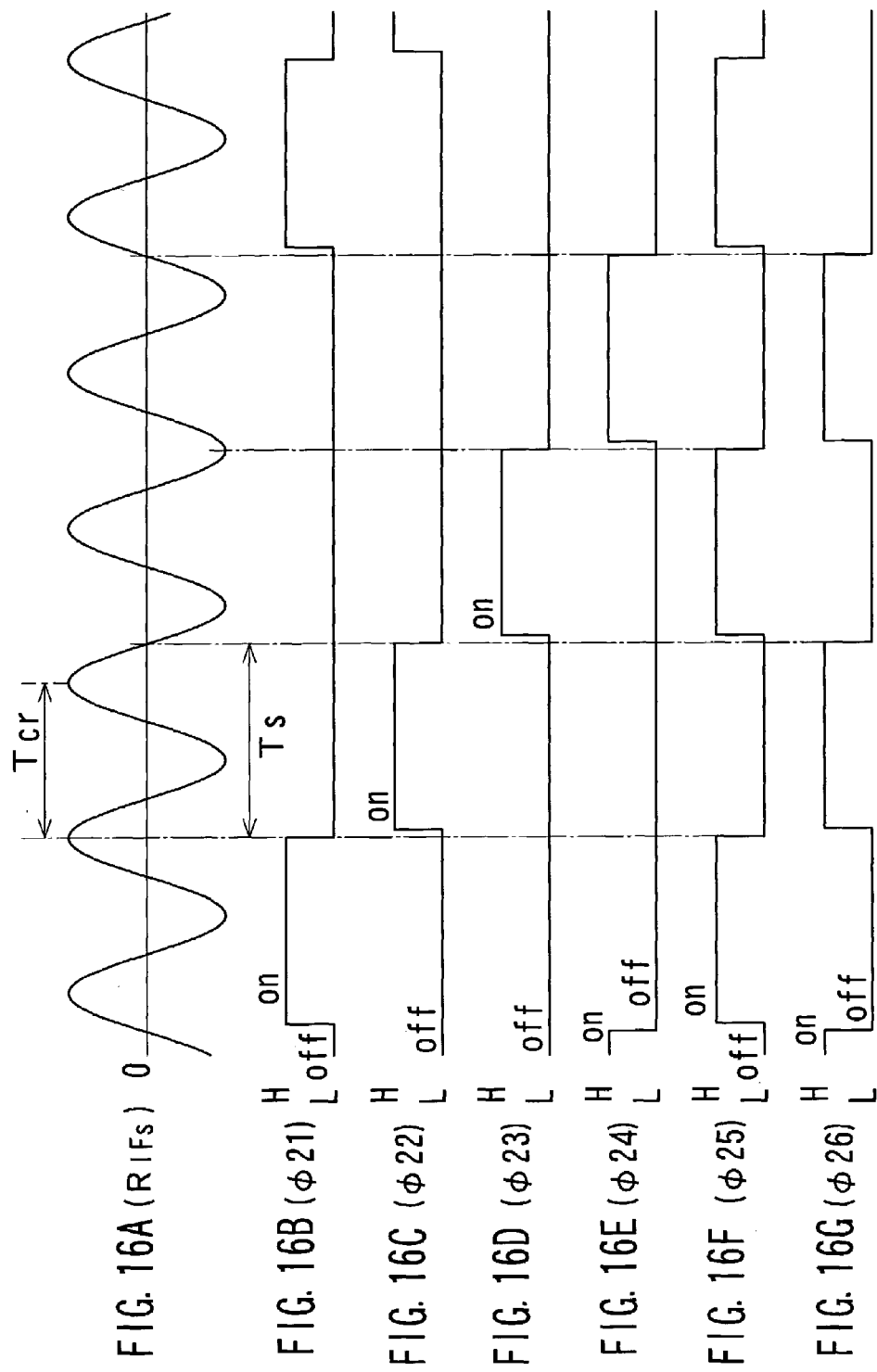
FIGS. 16A, 16B, 16C, 16D, 16E, 16F, and 16G are diagrams for showing signals which are supplied to the demodulated signal generation portion that uses the switched capacitor filter.

FIGS. 16A–16G show signals supplied to a demodulated signal generation portion 45a shown in FIG. 15, for explaining its operations. FIG. 16A shows the intermediate frequency signal RIFs and FIGS. 16B–16G show control signals $\phi 21$–$\phi 26$. During a period when these control signals $\phi 21$–$\phi 26$ are at high level "H", the switch circuit is in the conductive state and during a period when they are at low level "L", the switch circuit is in the non-conductive state.

The control signal $\phi 21$ is used to operate the switch circuits 452-p and 452-n. The control signal $\phi 23$ is used to operate the switch circuits 453-p and 453-n. Further, the control signals $\phi 22$ and $\phi 24$ are used to operate the switch circuits for generating the demodulated signal PQs. These control signals $\phi 21$–$\phi 24$ transfer the switch circuits to the non-conductive state at such timing as to have a frequency of the intermediate frequency signal RIFs multiplied by "1/(m+0.25)" or "1/(m+0.75)" (m: 0 or a natural number). If the frequency is multiplied by, for example, "1/(m+0.25)", those control signals transfer the switch circuits 453-p and 453-n to the non-conductive state at phase difference "π" with respect to timing at which the switch circuits 452-p and 452-n are made non-conductive. Further, those control signals transfer such switch circuits to the non-conductive state as to generate the demodulated signal PQs at phase differences "π/2" and "3π/2", respectively. Further, the control signals $\phi 25$ indicates a period during which the control signals $\phi 21$ and $\phi 23$ are at high level "H", while the control signal $\phi 26$ indicates a period during which the control signals $\phi 22$ and $\phi 24$ are at high level "H".

When the control signal $\phi 21$ is set to high level "H" to make the switch circuits 452-p and 452-n conductive, the capacitors 454-p and 454-n are charged according to a signal level of the intermediate frequency signal RIFs. Further, when the control signal $\phi 21$ is set to low level "L" to make the switch circuits 452-p and 452-n non-conductive, the capacitors 454-p and 454-n each hold a signal level at timing when they are transferred to the non-conductive state.

Next, when the control signal $\phi 22$ is set to high level "H", the switch circuits 458-p and 458-n are made conductive. In this case, the switch circuit 624 is made non-conductive by the control signal $\phi 25$ and the switch circuit 625 is made conductive by the control signal $\phi 26$. Therefore, the capacitors 622-p and 622-n are charged according to signal levels held in the capacitors 454-p and 454-n, respectively.

When the control signal $\phi 23$ is set to high level "H" to made the switch circuits 453-p and 453-n conductive, the capacitors 456-p and 456-n are charged according to a signal level of the intermediate frequency signal RIFs, respectively. Further, when the control signal φ23 is set to low level "L" to made the switch circuits 453-p and 453-n non-conductive, they each hold a signal level at timing when they are transferred to the non-conductive state. Further, during a period when the control signal φ23 is at high level "H", the switch circuit 625 is made non-conductive by the control signal φ26 and the switch circuits 624, 644-p, 644-n, 645-p, and 645-n are made conductive by the control signal φ25, to supply charge stored in the capacitors 622-p and 622-n to the differential amplifier 61.

When the control signal φ24 is set to high level "H", the switch circuits 459-p and 459-n are made conductive. In this case, the switch circuit 624 is made non-conductive by the control signal φ25 and the switch circuit 625 is made conductive by the control signal φ26. Therefore, the capacitors 622-p and 622-n are charged according to signal levels held in the capacitors 454-p and 454-n, respectively. The switch circuits 458 and 459 are configured so that they may be supplied with signals having opposite polarities, so that even if a signal level of the intermediate frequency signal RIFs when it is sampled by the control signal φ21 is opposite in polarity to that of the intermediate frequency signal RIFs when it is sampled by the control signal φ23, the capacitors 622-p and 622-n can be charged similarly to each other. Furthermore, the switch circuits 646-p and 646-n are made conductive by the control signal φ26, to discharge the capacitors 642-p and 642-n.

When the control signal φ21 is set to high level "H" to make the switch circuits 452-p and 452-n conductive again, the capacitors 454-p and 454-n are charged according to a signal level of the intermediate frequency signal RIFs. Further, when the control signal φ21 is set to low level "L" to make the switch circuits 452-p and 452-n non-conductive, they each hold a signal level at timing when they are transferred to the non-conductive state. Furthermore, during a period when the control signal φ21 is held at high level "H", the switch circuit 625 is made non-conductive by the control signal φ26 and the switch circuits 624, 644-p, 644-n, 645-p, and 645-n are made conductive by the control signal φ25, to supply charge stored in the capacitors 622-p and 622-n to the differential amplifier 61.

By repeating the processing similarly, it is possible to output the demodulated signal PIs on which filter processing has been processed, as a differential signal from the differential amplifier 61.

Further, by replacing the control signals φ21 and φ22 with each other, the control signals φ23 and φ24 with each other, and the control signals φ25 and φ26 with each other in FIG. 15, it is possible to output the demodulated signal PQs on which filter processing has been processed, as a differential signal from the differential amplifier 61.

Although the demodulated signal generation portion 45a shown in FIG. 15 has been configured to match the polarities of the signals with each other and then supply the signals to the switched capacitor filter block 45-3, the polarities of the signals may be inverted on the side of the switched capacitor filter block. A second configuration, shown in FIG. 17, of the demodulated signal generation portion that uses the switched capacitor filter is employed by the side of the switched capacitor filter block to perform filter processing in inverted polarities.

The intermediate frequency signal RIFs is applied between input terminals 461-p and 461-n in a demodulated signal generation portion 45b. The input terminal 461-p is connected through a switch circuit 462-p, which constitutes a sampling block 45b-1, to one terminal of a capacitor 463-p, which constitutes a signal generation block 45b-2. Further, the input terminal 461-n is connected through a switch circuit 462-n to one terminal of a capacitor 463-n. The other terminals of the capacitors 463-p and 463-n are grounded.

The one terminal of the capacitor 463-p is connected through an amplifier 464-p to one terminals of the switch circuits 465-p and 466-p and the other terminal of the capacitor 463-n is connected through an amplifier 464-n to one terminals of the switch circuits 465-n and 466-n.

The other terminals of the switch circuits 465-p and 466-p are connected to one terminal of the capacitor 622-p and one terminals of the switch circuits 626 and 627, which constitute the switched capacitor filter block 45b-3. The other terminals of the switch circuits 465-n and 466-n are connected to one terminal of the capacitor 622-n and the other terminals of the switch circuits 626 and 627.

The other terminal of the capacitor 622-p is connected to one terminals of the switch circuits 628, 629, 647-p, and 648-p, and the capacitor 642-p. The other terminal of the capacitor 642-p is grounded through the switch circuits 649-p and 650-p. Furthermore, the other terminal of the capacitor 642-p is connected through a switch circuit 651-p to the positive-pole side output terminal of the differential amplifier 61 and also through a switch circuit 652-p to the negative pole side output terminal of the differential amplifier 61.

The other terminal of the switch circuit 647-p is connected to the inverting input terminal and also to the output terminal through the integration capacitor 63-p. Further, the other terminal of the switch circuit 648-p is connected to the non-inverting input terminal and also to the output terminal through an integration capacitor 63-n.

The other terminal of the capacitor 622-n is connected to the other terminals of the switch circuits 628 and 629 and one terminals of the switch circuits 647-n and 648-n and the capacitor 642-n. The other terminal of the capacitor 642-n is grounded through the switch circuits 649-n and 650-n. Further, the other terminal of the capacitor 642-n is connected through the switch circuit 651-n to the negative-pole side output terminal of the differential amplifier 61 and also through the switch circuit 652-n to the positive-pole side output terminal of the differential amplifier 61.

The other terminal of the switch circuit 647-n is connected to the non-inverting input terminal. Further, the other terminal of the switch circuit 648-n is connected to the inverting input terminal.

In the demodulated signal generation portion 45b thus configured, the polarity of the supplied signal used is inverted between a case where the switch circuit is made conductive by the control signal φ21 and a case where the switch circuit is made conductive by the control signal φ23. Therefore, it is possible to obtain the demodulated signals PIs and PQs from the differential amplifier 61 without charging the capacitor of the switched capacitor filter with the polarity inverted.

Figure 17:
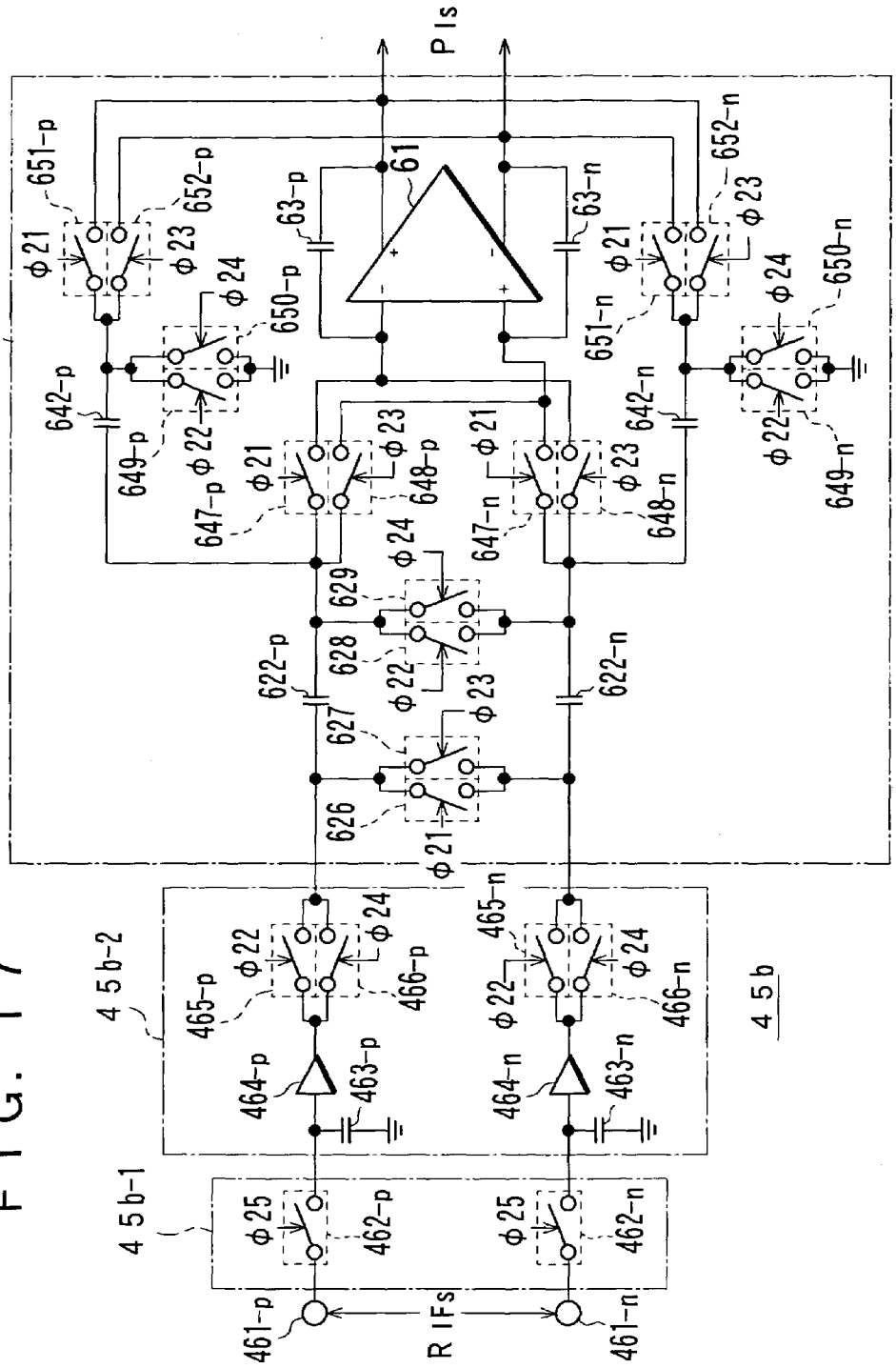
FIG. 17 is a diagram for showing a second configuration of the demodulated signal generation portion that uses the switched capacitor filter.

Further, by replacing the control signals φ21 and φ22 with each other and the control signals φ23 and φ24 with each other in FIG. 17, it is possible to obtain the demodulated signal PQs in place of the demodulated signal PIs.

Further, also when a switched capacitor filter is used, if charge injection occurs because the capacitor is charged through a switch circuit, there may occur such a case that a properly demodulated signal cannot be obtained because charge transferred by the switched capacitor filter does not indicate a signal level of the intermediate frequency signal RIFs. Therefore, by using the above-described unity gain sample buffer as an input stage, highly accurate demodulation processing can be performed by a simple configuration.

Figure 18:
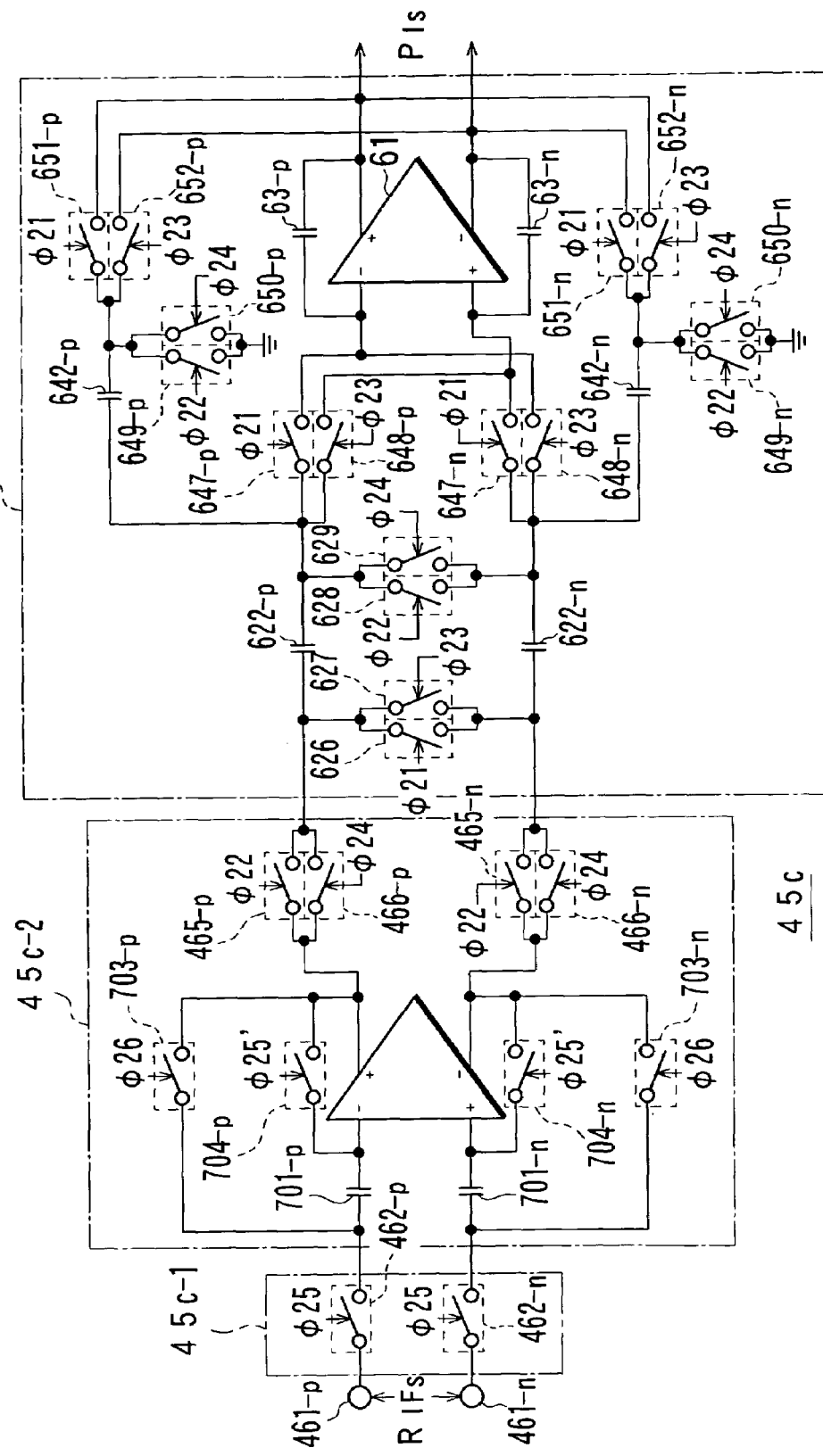
FIG. 18 is a diagram for showing a third configuration of the demodulated signal generation portion that uses the switched capacitor filter.

FIG. 18 shows a third configuration of the demodulated signal generation portion that uses the switched capacitor filter, in which the unity gain sample buffer is used as an input stage. It is to be noted that FIG. 18 shows a case where a sampling block 45c-1 and a switched capacitor filter block 45c-3 have the same configurations as the sampling block 45b-1 and the switched capacitor filter block 45b-3, respectively.

In a signal generation block 45c-2, a signal to be supplied to the switched capacitor filter block 45c-3 is generated by using the unity gain sample buffer. It is to be noted that the control signal ϕ25 is used as a control signal ϕc1 shown in FIGS. 12A–12C and the control signal ϕ26 is used as a control signal ϕc3. Further, as a control signal ϕc2, a control signal ϕ25' is used which provides earlier falling timing than the control signal ϕ25.

By thus configuring a demodulated signal generation portion 45c, it is possible to obtain the highly accurate demodulated signal PIs as a differential signal by using a simple configuration. Further, by replacing the control signals ϕ21 and ϕ22 with each other, the control signals ϕ23 and ϕ24 with each other, and the control signals ϕ25 and ϕ26 with each other and generating a control signal ϕ26' that provides earlier falling timing than the control signal ϕ26 to use it as the control signal ϕc2, it is possible to obtain the highly accurate demodulated signal PQs as a differential signal.

Although in the demodulated signal generation portions 45a, 45b, and 45c, the intermediate frequency signal RIFs has been used to generate the demodulated signals PI and PQ, the demodulated signals PIs and PQs can also be generated by sampling the received signal RB output from the low noise amplifier 12 as in the case of these demodulated signal generation portions 45a, 45b, and 45c. In this case, the sampling frequency Fs is set to a frequency of a received signal multiplied by "1/(m+0.25)" or "(1/(m+0.75)" (m: 0 or natural number) so that it is subject to sampling processing, to match polarities of signals having phase difference "π" from each other and synthesize them. By thus generating the demodulated signals PIs and PQs directly from the received signal RB, it is possible to obtain the highly accurate demodulated signals PIs and PQs simply without using a frequency converter or the like. Further, by increasing the value of "m", it is also possible to obtain the demodulated signals PIs and PQs without performing processing at a high frequency.

Further, by using a switched capacitor filter, it is possible to easily generate the control signal DP or the clock signal CKb which is used in a receiving set. It is here supposed that the sampling frequency is set to "p times" or "1/p times" (p: natural number) a switching frequency of the switched capacitor filter, the switching frequency of the switched capacitor filter is set to "q times" or "1/q times" (q: natural number) a clock frequency of the A/D converter, and the clock frequency of the A/D converter is set to "r times" (r: natural number) a symbol rate determined by a modulation scheme employed by the received signal or the intermediate frequency signal. For example, in a W-CDMA type mobile communication system, the symbol rate is set to 3.84 MHz. Therefore, a frequency of 15.36 MHz, which is four times (r=4) the symbol rate, is generally used in the A/D converters 23 and 24. In such a case, if the clock frequency of the switched capacitor filter is set to four times (q=4) the clock frequency of the A/D converters 23 and 24, 61.44 MHz is given.

If, in this case, the sampling frequency is set to twice (p=2) the clock frequency of the switched capacitor filter, 122.88 MHz is given, and if the sampling period is (1+0.25) Tcs, the intermediate frequency signal RIFs has a frequency of 153.6 MHz. If the sampling frequency is (2+0.25)Tcs, on the other hand, the intermediate frequency signal RIFs has a frequency of 276.48 MHz.

Since the frequency of the intermediate frequency signal RIFs is thus not an integral multiple of the sampling frequency or the clock frequency, a signal having such a frequency has no influence on the intermediate frequency signal RIFs.

Further, the signal is sampled, the capacitor is switched, and the A/D converter converts the signals in synchronization with each other and so can prevent themselves from affecting an analog circuit. Further, each of the magnifications is set to a multiple of a natural number or its inverse number, so that it is possible to easily generate a signal having, for example, a reference frequency divided by or multiplied by an arbitrary number.

PROBABILITY OF UTILIZED INDUSTRIALIZATION

The present invention makes it possible to easily obtain a demodulated signal by a simple configuration and so is useful in a variety of devices having reception functions such as a wireless LAN (local area network), a cellular phone, and a global positioning system (GPS).

The invention claimed is:

1. A demodulation circuit comprising:
sampling means for sampling a modulated signal;
signal synthesis means for synthesizing and holding the signals sampled by the sampling means;
polarity adjustment means for matching polarities of the signals synthesized by the signal synthesis means, with each other; and
demodulation control means for driving the sampling means to sample the modulated signal at a frequency of the modulated signal multiplied by "1/(m+0.25)" or "1/(m+0.75)" (m: 0 or natural number) and also driving the signal synthesis means to synthesize and hold the signals having phase difference "π" from each other to allow a demodulated signal to be generated by the signal synthesis means,
wherein the polarity adjustment means supplies the modulated signal having an inverted polarity to the sampling means, thereby matching polarities of the signals synthesized by the signal synthesis means.

2. The demodulation circuit according to claim 1, wherein the polarity adjustment means inverts polarities of the signals sampled by the sampling means, thereby matching polarities of the signals synthesized by the signal synthesis means.

3. A demodulation circuit comprising:
sampling means for sampling a modulated signal;
signal synthesis means for synthesizing and holding the signals sampled by the sampling means;
polarity adjustment means for matching polarities of the signals synthesized by the signal synthesis means, with each other; and
demodulation control means for driving the sampling means to sample the modulated signal at a frequency of the modulated signal multiplied by "1/(m+0.25)" or "1/(m+0.75)"0 (m: 0 or natural number) and also driving the signal synthesis means to synthesize and hold the signals having phase difference "π" from each other to allow a demodulated signal to be generated by the signal synthesis means, wherein the demodulation control means drives the sampling means to sample the modulated signal with its polarity being inverted, thereby integrating the polarity adjustment means into the demodulation control means.

4. A demodulation circuit comprising:

sampling means for sampling a modulated signal;

signal synthesis means for synthesizing and holding the signals sampled by the sampling means;

polarity adjustment means for matching polarities of the signals synthesized by the signal synthesis means, with each other; and demodulation control means for driving the sampling means to sample the modulated signal at a frequency of the modulated signal multiplied by "1/(m+0.25)" or "1/(m+0.75)" (m: 0 or natural number) and also driving the signal synthesis means to synthesize and hold the signals having phase difference "π" from each other to allow a demodulated signal to be generated by the signal synthesis means, wherein the sampling means is constituted of a unity gain sample buffer.

5. A demodulation circuit comprising:

sampling means for sampling a modulated signal;

switched capacitor filter means;

signal generation means for generating a signal on which the switched capacitor filter means performs filter processing, based on the signal sampled by the sampling means; and demodulation control means for driving the sampling means to sample the modulated signal at a frequency of the modulated signal multiplied by "1/(m+0.25)" or "1/(m+0.75)" (m: 0 or natural number), to supply a signal to undergo the filter processing based on a signal having phase difference "π" from the sampled signal, from the signal generation means to the switched capacitor filter means, thereby allowing a demodulated signal to be output from the switched capacitor filter means.

6. The demodulation circuit according to claim 5, wherein the demodulation control means drives the sampling means to sample the modulated signal with its polarity being inverted or drives the signal generation means to generate a signal to undergo the filter processing with its polarity being inverted, thereby matching polarity of the signal supplied to the switched capacitor filter means.

7. The demodulation circuit according to claim 5, wherein if the polarity of signal to undergo the filter processing, said signal being supplied to the switched capacitor filter means, is inverted, the demodulation control means drives the switched capacitor filter means to perform the filter processing by using the supplied signal with the inverted polarity.

8. The demodulation circuit according to claim 5, wherein the signal generation means is constituted of a unity gain sample buffer.

9. A receiving set comprising:

sampling means for sampling a received signal or an intermediate frequency signal;

switched capacitor filter means;

signal generation means for generating a signal on which the switched capacitor filter means performs filter processing, based on the signal sampled by the sampling means; and demodulation control means for driving the sampling means to sample the modulated signal at a frequency of the modulated signal multiplied by "1/(m+0.25)" or "1/(m+0.75)"0 (m: 0 or natural number), to supply a signal to undergo the filter processing based on a signal having phase difference "π" from the sampled signal, from the signal generation means to the switched capacitor filter means, thereby allowing a demodulated signal to be output from the switched capacitor filter means.

10. The receiving set according to claim 9, further comprising signal conversion means for converting said demodulated signal output from the switched capacitor filter means into a digital signal, wherein the demodulation control means sets a sampling frequency at the sampling means to a switching frequency of the switched capacitor filter means multiplied by "p" or "1/p" (p: natural number), the switching frequency of the switched capacitor filter means to a clock frequency of the signal conversion means multiplied by "q" or "1/q" (q: natural number), and the clock frequency of the signal conversion means to "r times" (r: natural number) a symbol rate determined by a modulation scheme employed by the received signal or the intermediate frequency signal.

* * * * *

UNITED STATES PATENT AND TRADEMARK OFFICE
CERTIFICATE OF CORRECTION

PATENT NO. : 7,190,216 B2
APPLICATION NO. : 10/525494
DATED : March 13, 2007
INVENTOR(S) : Kazuyuki Saijo et al.

It is certified that error appears in the above-identified patent and that said Letters Patent is hereby corrected as shown below:

Column 22, Line 65:

" '1/(m+0.75)' 0" should read -- "1/(m+0.75)" --.

Column 24, Line 24:

" '1/(m+0.75)' 0" should read -- "1/(m+0.75)" --.

Signed and Sealed this

Twenty-eighth Day of August, 2007

JON W. DUDAS
*Director of the United States Patent and Trademark Office*